(12) United States Patent
Brown et al.

(10) Patent No.: US 7,579,090 B2
(45) Date of Patent: *Aug. 25, 2009

(54) ORGANIC ELEMENT FOR ELECTROLUMINESCENT DEVICES

(75) Inventors: Christopher T. Brown, Rochester, NY (US); Joseph C. Deaton, Rochester, NY (US); David W. Place, Webster, NY (US); Marina E. Kondakova, Kendall, NY (US); Shouquan Huo, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 548 days.

This patent is subject to a terminal disclaimer.

(21) Appl. No.: 11/016,134

(22) Filed: Dec. 17, 2004

(65) Prior Publication Data

US 2006/0063031 A1 Mar. 23, 2006

Related U.S. Application Data

(63) Continuation-in-part of application No. 10/945,337, filed on Sep. 20, 2004, now abandoned.

(51) Int. Cl.
*H01L 51/54* (2006.01)
*C09K 11/06* (2006.01)

(52) U.S. Cl. .................. 428/690; 428/917; 313/504; 313/506; 257/98

(58) Field of Classification Search ................. 428/690, 428/917; 252/301.16; 257/98; 313/504, 313/506
See application file for complete search history.

(56) References Cited

U.S. PATENT DOCUMENTS

| 5,141,671 | A | 8/1992 | Bryan et al. |
| 6,392,250 | B1 | 5/2002 | Aziz et al. |
| 6,602,618 | B2 | 8/2003 | Watanabe et al. |
| 6,893,743 | B2 * | 5/2005 | Sato et al. .................. 428/690 |

(Continued)

FOREIGN PATENT DOCUMENTS

EP 0 534 510 3/1993

(Continued)

OTHER PUBLICATIONS

Chen et al., Proceedings of SPIE (1998), vol. 3421 (Display Technologies II), pp. 78-82.*

(Continued)

*Primary Examiner*—Dawn Garrett
(74) *Attorney, Agent, or Firm*—Arthur E. Kluegel; Raymond L. Owens

(57) ABSTRACT

An OLED device contains a layer comprising a hole transporting compound, a certain type of oxinoid compound, and a light emitting phosphorescent compound.

44 Claims, 2 Drawing Sheets

U.S. PATENT DOCUMENTS

| | | |
|---|---|---|
| 2002/0086180 A1 | 7/2002 | Seo et al. |
| 2002/0101154 A1 | 8/2002 | Seo et al. |
| 2002/0105005 A1 | 8/2002 | Seo et al. |
| 2002/0109136 A1 | 8/2002 | Seo et al. |
| 2002/0121860 A1 | 9/2002 | Seo et al. |
| 2002/0135296 A1 | 9/2002 | Aziz et al. |
| 2003/0087125 A1 | 5/2003 | Aziz et al. |
| 2003/0104244 A1 | 6/2003 | Aziz et al. |
| 2003/0108770 A1 | 6/2003 | Hamada et al. |
| 2003/0129452 A1 | 7/2003 | Tsuji et al. |
| 2003/0134146 A1 | 7/2003 | Aziz et al. |
| 2003/0141809 A1 | 7/2003 | Furugori et al. |

FOREIGN PATENT DOCUMENTS

| | | |
|---|---|---|
| EP | 0 579 151 | 1/1994 |
| WO | 03/083009 | 10/2003 |

OTHER PUBLICATIONS

J. C. Deaton, et al., "Synthesis for Organometallic Cyclometallated Transition Metal Complexes", U.S. Appl. No. 10/729,263 (D-87223) filed Dec. 5, 2003.

J. C. Deaton, "Synthesis of Organometallic Cyclometallated Group VIIIB Metal Complexes", U.S. Appl. No. 10/879,412 (D-88246) filed Jun. 29, 2004.

J. C. Deaton, "Synthesis of Organometallic Cyclometallated Transition Metal Complexes", U.S. Appl. No. 10/879,657 (D-88247) filed Jun. 29, 2004.

J. C. Deaton, et al., "Organic Electroluminescent Devices and Composition", (D-88512) filed Sep. 20, 2004, U.S. Appl. No. 10/945,338.

J. C. Deaton, et al., "Organic Electroluminescent Devices and Composition", U.S. Appl. No. 10/ 11/015,929 (D-88512A) filed herewith, Dec. 17, 2004.

S. Huo, et al., "OLEDS with Mixed-Ligand Cyclometallated Complexes", U.S. Appl. No. 11/015,627, (D-88790) filed herewith, Dec. 17, 2004.

Y. Wu, et al., "Structural Effect of BAlqs on the EL Performance of Phosphorescent Organic Electroluminescent Devices", IDW, 2003, pp. 1343-1346.

C. Yang, et al., "Synthesis of a high-efficiency red phosphorescent emitter for organic light-emitting diodes", Journal of Materials Chemistry, 2004, pp. 947-950.

* cited by examiner

ORGANIC ELEMENT FOR ELECTROLUMINESCENT DEVICES

CROSS REFERENCE TO RELATED APPLICATION

This application is a Continuation-In-Part of U.S. Ser. No. 10/945,337, now abandoned, entitled Organic Element for Electroluminescent Device filed on Sep. 20, 2004, and co-filed with an application entitled "Organometallic Materials And Electroluminescent Devices", U.S. Ser. No. 11/016,460, now abandoned, the contents of which are incorporated herein by reference.

FIELD OF THE INVENTION

This invention relates to an organic light emitting diode (OLED) electroluminescent (EL) device comprising a light-emitting layer containing an organometallic complex that can provide desirable electroluminescent properties.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322-334, 1969; and Dresner U.S. Pat. No. 3,710,167, issued Jan. 9, 1973. The organic layers in these devices, usually composed of a polycyclic aromatic hydrocarbon, were very thick (much greater than 1 μm). Consequently, operating voltages were very high, often >100V.

More recent organic EL devices include an organic EL element consisting of extremely thin layers (e.g. <1.0 μm) between the anode and the cathode. Herein, the term "organic EL element" encompasses the layers between the anode and cathode. Reducing the thickness lowered the resistance of the organic layer and has enabled devices that operate much lower voltage. In a basic two-layer EL device structure, described first in U.S. Pat. No. 4,356,429, one organic layer of the EL element adjacent to the anode is specifically chosen to transport holes, and therefore, it is referred to as the hole-transporting layer, and the other organic layer is specifically chosen to transport electrons, and is referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by Tang et al [*J. Applied Physics*, Vol. 65, Pages 3610-3616, 1989]. The light-emitting layer commonly consists of a host material doped with a guest material, also known as the dopant. Still further, there has been proposed in U.S. Pat. No. 4,769,292 a four-layer EL element comprising a hole-injecting layer (HIL), a hole-transporting layer (HTL), a light-emitting layer (LEL) and an electron transport/injection layer (ETL). These structures have resulted in improved device efficiency.

In organic electroluminescent devices, only 25% of electrons and holes recombine as singlet states while 75% recombine as triplet states according to simple spin statistics. Singlet and triplet states, and fluorescence, phosphorescence, and intersystem crossing are discussed in J. G. Calvert and J. N. Pitts, Jr., *Photochemistry* (Wiley, N.Y., 1966) and further discussed in publications by S. R. Forrest and coworkers such as M. A. Baldo, D. F. O'Brien, M. E. Thompson, and S. R. Forrest, *Phys. Rev. B*, 60, 14422 (1999). The singular term "triplet state" is often used to refer to a set of three electronically excited states of spin 1 that have nearly identical electronic structure and nearly identical energy and differ primarily in the orientation of the net magnetic moment of each state. A molecule typically has many such triplet states with widely differing energies. As used hereinafter, the term "triplet state" of a molecule will refer specifically to the set of three spin-1 excited states with the lowest energy, and the term "triplet energy" will refer to the energy of these states relative to the energy of the ground state of the molecule. Similarly, the term "singlet energy" will refer to the energy of the lowest excited singlet state relative to that of the ground state of the molecule. Emission from triplet states is generally very weak for most organic compounds because the transition from triplet excited state to singlet ground state is spin-forbidden. Hence, many emitting materials that have been described as useful in an OLED device emit light from their excited singlet state by fluorescence and thereby utilize only 25% of the electron and hole recombinations. Thus, it is possible, by the proper choice of host and dopant, to collect energy from both the singlet and triplet excitons created in an OLED device and to produce a very efficient phosphorescent emission. The term electrophosphorescence is sometimes used to denote electroluminescence wherein the mechanism of luminescence is phosphorescence. However, it is possible for compounds with states possessing a strong spin-orbit coupling interaction to emit strongly from triplet excited states to the singlet ground state (phosphorescence). One such strongly phosphorescent compound is fac-tris(2-phenyl-pyridinato-N^C—)Iridium(III) (Ir(ppy)$_3$) that emits green light (K. A. King, P. J. Spellane, and R. J. Watts, *J. Am. Chem. Soc.*, 107, 1431 (1985), M. G. Colombo, T. C. Brunold, T. Reidener, H. U. Güdel, M. Fortsch, and H.-B. Bürgi, *Inorg. Chem.*, 33, 545 (1994)). Organic electroluminescent devices having high efficiency have been demonstrated with Ir(ppy)$_3$ as the phosphorescent material and 4,4'-N,N'-dicarbazole-biphenyl (CBP) as the host (M. A. Baldo, S. Lamansky, P. E. Burrows, M. E. Thompson, S. R. Forrest, *Appl. Phys. Lett.*, 75, 4 (1999), T. Tsutsui, M.-J. Yang, M. Yahiro, K. Nakamura, T. Watanabe, T. Tsuji, Y. Fukuda, T. Wakimoto, S. Miyaguchi, *Jpn. J. Appl. Phys.*, 38, L1502 (1999)). Additional disclosures of phosphorescent materials and organic electroluminescent devices employing these materials are found in U.S. Pat. No. 6,303238 B1, WO 00/57676, WO 00/70655 and WO 01/41512 A1, Yersin et al, Proceedings of SPIE Vol. 5214, 124-132.

Bryan et al U.S. Pat. No. 5,141,671 disclose mixed-ligand aluminum chelate complexes having the property of blue emission for use in organic electroluminescent devices. Tsuji et al US 2003/0129452 A1 disclose the use of these blue-emissive aluminum chelate compounds as single host materials in red phosphorescent organic electroluminescent devices. Seo US 2002 0101154 A1 discloses a prophetic example of a device with a light emitting layer comprising a particular one of the blue-emissive aluminum chelates, bis(2- methyl-8-quinolinolato)(4-phenyl-phenolato)aluminum (III), and NPB and the PtOEP dopant in a composition of 80:20:4, respectively.

In the absence of experimental data the triplet energies may be estimated in the following manner. The triplet state energy for a molecule is defined as the difference between the ground state energy (E(gs)) of the molecule and the energy of the lowest triplet state (E(ts)) of the molecule, both given in eV. These energies can be calculated using the B3LYP method as implemented in the Gaussian98 (Gaussian, Inc., Pittsburgh, Pa.) computer program. The basis set for use with the B3LYP method is defined as follows: MIDI! for all atoms for which MIDI! is defined, 6-31G* for all atoms defined in 6-31G* but not in MIDI!, and either the LACV3P or the LANL2DZ basis set and pseudopotential for atoms not defined in MIDI! or 6-31G*, with LACV3P being the prefer-red method. For any remaining atoms, any published basis set and pseudopotential may be used. MIDI!, 6-31 G* and LANL2DZ are used as implemented in the Gaussian98 computer code and LACV3P is used as implemented in the Jaguar 4.1 (Schrodinger, Inc., Portland Oreg.) computer code. The energy of each state is computed at the minimum-energy geometry for that state. The difference in energy between the two states is further modified by Equation 1 to give the triplet state energy (E(t)):

$$E(t)=0.84*(E(ts)-E(gs))+0.35 \quad (1)$$

For polymeric or oligomeric materials, it is sufficient to compute the triplet energy over a monomer or oligomer of sufficient size so that additional units do not substantially change the computed triplet energy of the phosphorescent light emitting material.

One class of useful phosphorescent materials is the transition metal complexes having singlet ground states and triplet excited states. For example, fac-tris(2-phenylpyridinato-N, $C^{2'}$)iridium(III) (Ir(ppy)$_3$) strongly emits green light from a triplet excited state owing to the large spin-orbit coupling of the heavy atom and to the lowest excited state which is a charge transfer state having a Laporte allowed (orbital symmetry) transition to the ground state (K. A. King, P. J. Spellane, and R. J. Watts, *J. Am. Chem. Soc.*, 107, 1431 (1985), M. G. Colombo, T. C. Brunold, T. Reidener, H. U. Güdel, M. Fortsch, and H.-B. Bürgi, *Inorg. Chem.*, 33, 545 (1994). Small-molecule, vacuum-deposited OLEDs having high efficiency have also been demonstrated with Ir(ppy)$_3$ as the phosphorescent material and 4,4'-N,N'-dicarbazole-biphenyl (CBP) as the host (M. A. Baldo, S. Lamansky, P. E. Burrows, M. E. Thompson, S. R. Forrest, *Appl. Phys. Lett.*, 75, 4 (1999), T. Tsutsui, M.-J. Yang, M. Yahiro, K. Nakamura, T. Watanabe, T. Tsuji, Y. Fukuda, T. Wakimoto, S. Miyaguchi, *Jpn. J. Appl. Phys.*, 38, L1502 (1999)). LeCloux et al. in International Patent Application WO 03/040256 A2, and Petrov et al. in International Patent Application WO 02/02714 A2 teach additional iridium complexes for electroluminescent devices.

Additives have been used to improve the efficiency of triplet OLED devices. In U.S. 2002/0071963 A1, 4-(dicyanomethylene)-2-t-butyl-6-(1,1,7,7-tetramethyljulolidyl-9-enyl)-4H-pyran (DCJTB) was used as an additive to a triplet light-emitting layer. However, DCJTB suffers from having singlet emission in the red region of the spectrum and therefore can affect the color of the emission of a triplet OLED device. In particular, if an OLED device with blue or green emission is desired, a red contribution from DCJTB emission would be undesirable.

Notwithstanding these developments, there remains a need for new host materials, and especially hosts that will function with phosphorescent materials to provide improved efficiency, stability, manufacturability, or spectral characteristics of electroluminescent devices.

SUMMARY OF THE INVENTION

The invention provides an organic light emitting device containing a cathode, an anode, and having located therebetween a light emitting layer comprising:
A) co-hosts including
   a) a hole transporting compound, and
   b) an oxinoid compound, wherein the oxinoid is an aluminum bis-(2-substituted)oxinoid compound bearing a third ligand linked to aluminum through an oxygen atom to an aromatic ring moiety bearing at least one substituent at an ortho or a meta position; and
B) a light emitting phosphorescent compound.

The invention also provides a novel composition useful in the device and corresponding lighting processes. The device exhibits improved efficiency, stability, manufacturability, and/or spectral characteristics of electroluminescent devices.

DETAILED DESCRIPTION OF THE INVENTION

Figure 1:
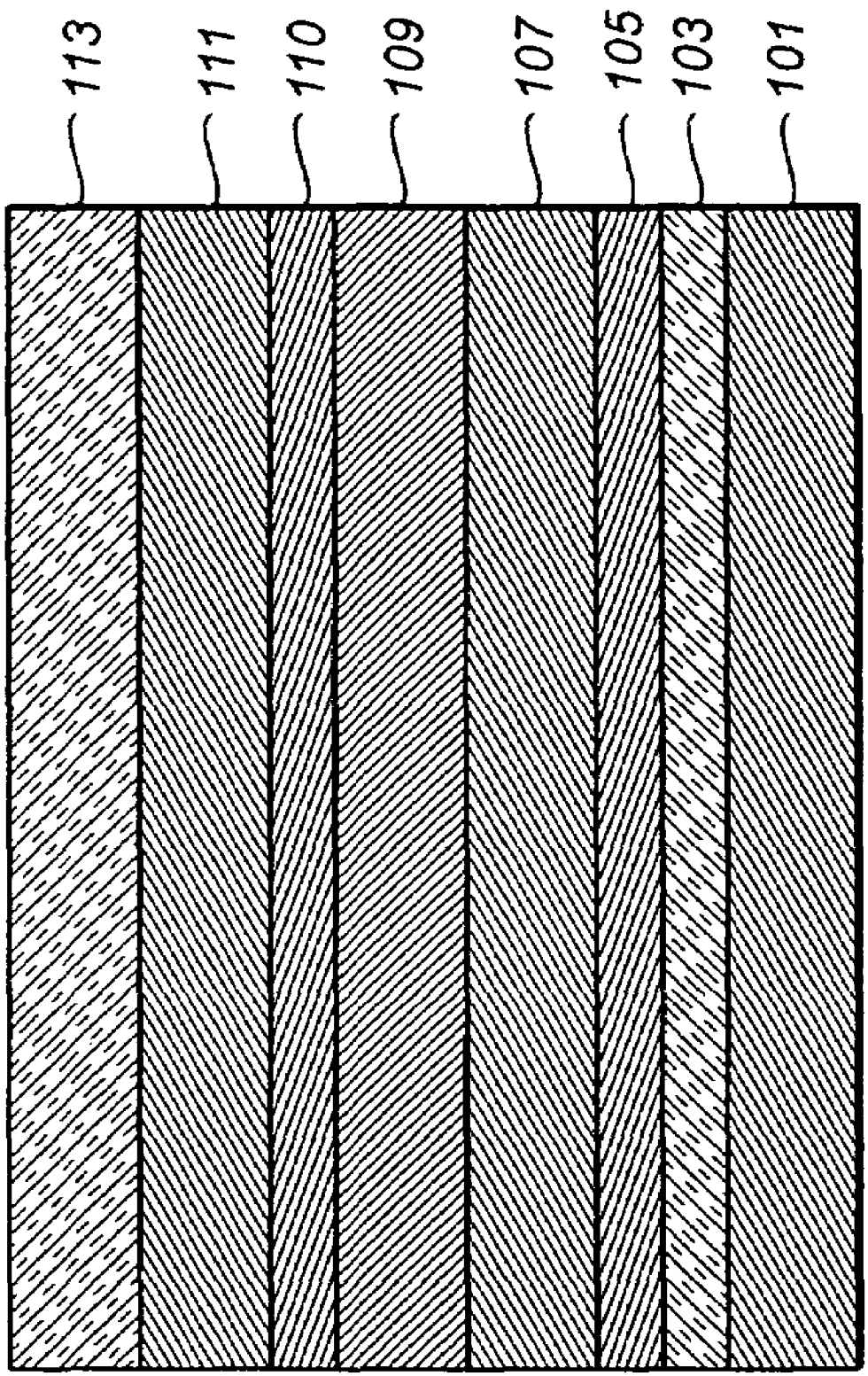
FIG. 1 shows a cross-section of a typical OLED device in which this invention may be used.

The object of the present invention is to provide high efficiency OLEDs with low drive voltage and good operational lifetime. The electroluminescent device is summarized above. The device can also include a hole-injecting layer, a hole-transporting layer, a hole-blocking layer, an electron-transporting layer, or more than one of these optional layers. In some embodiments, the light-emitting layer is conveniently a red- or orange-light emitting layer. This is accomplished with an organic light emitting device containing a cathode, an anode, and having located there-between a light emitting layer comprising:
A) co-hosts including
   a) a hole transporting compound, and
   b) an oxinoid compound, wherein the oxinoid is an aluminum bis-(2-substituted)oxinoid compound bearing a third ligand comprising a phenolato group bearing at least one substituent at an ortho or a meta position
B) a light emitting phosphorescent compound.

In the present invention, the oxinoid co-host is suitably selected as an aluminum bis-(2-substituted)oxinoid compound bearing a third ligand comprising an aromatic-oxy group or oxy moiety according to the formula (I) below:

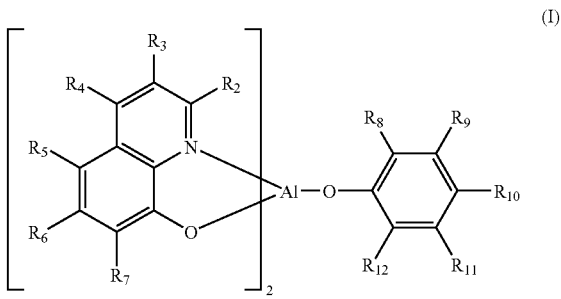

wherein:
R$_2$ represents an electron donating group,
R$_3$ and R$_4$ each independently represent hydrogen or an electron donating group,
R$_5$, R$_6$, and R$_7$ each independently represent hydrogen or an electron accepting group,
R$_{10}$ represents hydrogen or a substituent group, and
at least one of R$_8$, R$_9$, R$_{11}$, and R$_{12}$ represents a substituent group with the proviso that R$_9$ and R$_{10}$ or R$_{10}$ and R$_{11}$ may join to form a fused ring provided at least one of the remaining R$_8$, R$_9$, R$_{11}$, and R$_{12}$ represents a substituent group, and with the further proviso that R$_8$ and R$_9$ or R$_{11}$ and R$_{12}$ may join to form a fused ring.

In formula (I), R$_2$ may be a suitable electron donating group such as one selected from —R', —OR', and —NR'(R") where R' is a hydrocarbon containing up to 6 carbon atoms and R" is hydrogen or R'. Specific examples of R$_2$ include methyl, ethyl, phenyl, methoxy, ethoxy, phenoxy, —N(CH$_3$)$_2$, —N(CH$_2$CH$_3$)$_2$, —NHCH$_3$, —N(C$_6$H$_5$)$_2$, —N(CH$_3$)(C$_6$H$_5$), and —NHC$_6$H$_5$. One preferred group for R$_2$ is methyl. R$_3$ and R$_4$ may each independently be selected from the same groups as R$_2$. Additionally, R$_3$ and R$_4$ may independently be hydrogen since an electron donating group at these positions is not required. One preferred group for R$_4$ is methyl. In another preferred embodiment, R$_2$ and R$_4$ are each methyl.

Each of R$_5$, R$_6$, and R$_7$ may be an electron accepting group such as one independently chosen from cyano, α-haloalkyl, α-haloalkoxy, amido, sulfonyl, carbonyl, carbonyloxy and oxycarbonyl substituents including those containing up to 10 carbon atoms. Specific example include —CN, —F, —CF$_3$, —OCF$_3$, —CONHC$_6$H$_5$, —SO$_2$C$_6$H$_5$, —COC$_6$H$_5$, —CO$_2$C$_6$H$_5$, and —OCOC$_6$H$_5$. Additionally, R$_5$, R$_6$, and R$_7$ may each independently be hydrogen since an electron accepting group at these positions is not required.

Substituents for R$_8$ to R$_{12}$ may be hydrogen or a substituent but at least one of R$_8$, R$_9$, R$_{11}$, and R$_{12}$ is a substituent and they may join to form rings with the provisos as outlined above. Suitable substituents for R$_8$ to R$_{12}$ are aryl such as phenyl, rings fused to the nucleus phenyl ring, fused ring carbocyclic or heterocyclic groups, trifluoromethyl, and other groups as specified for substituents herein.

It is well within the skill of the art to determine whether a particular group is electron donating or electron accepting. The most common measure of electron donating and accepting properties is in terms of Hammett σ values. Hydrogen has a Hammett σ value of zero, while electron donating groups have negative Hammett σ values and electron accepting groups have positive Hammett σ values. Lange's handbook of Chemistry, 12$^{th}$ Ed., McGraw Hill, 1979, Table 3-12, pp. 3-134 to 3-138, here incorporated by reference, lists Hammett σ values for a large number of commonly encountered groups. Hammett σ values are assigned based on phenyl ring substitution, but they provide a practical guide for qualitatively selecting electron donating and accepting groups for the quinoline ring.

These compounds possess the property of fluorescent light-emission (i.e. from singlet excited states) that is blue-shifted relative to other aluminum oxinoid compounds such as tris(8-quinolinolato)aluminum(III) (Alq). These aluminum bis-(2-substituted)oxinoid compounds bearing a third ligand comprising an aromatic-oxy group also provide a higher triplet energy than other aluminum oxinoid compounds such as Alq, thereby providing higher luminous efficiency when employed in conjunction with phosphorescent dopants emitting from a triplet excited state as in the present invention, especially when the oxinoid compound is selected to have a triplet energy higher than that of the phosphorescent dopant. These aluminum oxinoid materials possess electron-transporting property for the host mixture. Excellent operational lifetime of the devices can be obtained with these materials. These aluminum bis-(2-substituted)oxinoid compounds bearing a third ligand comprising an aromatic-oxy group, or oxy moiety, employed in the present invention also provide a higher ionization potential than other aluminum oxinoid compounds such as Alq, thus making it more difficult for holes to escape the emissive layer, especially when an undoped layer is placed between the emissive layer and the cathode or any additional electron transporting materials. The aluminum oxinoid compounds employed in the present invention may be made according to procedures found in Bryan et al U.S. Pat. No. 5,141,671.

Illustrative examples of complexes of the materials of formula (1) useful in the present invention are the following:

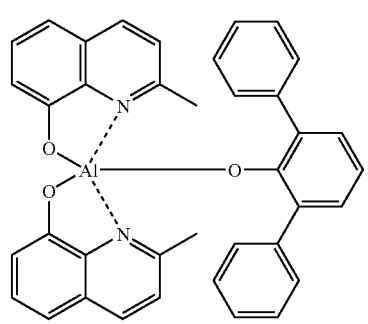

INV-1

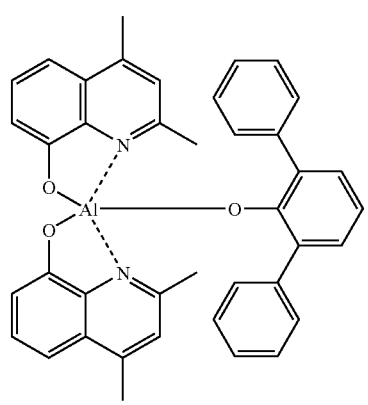

INV-2

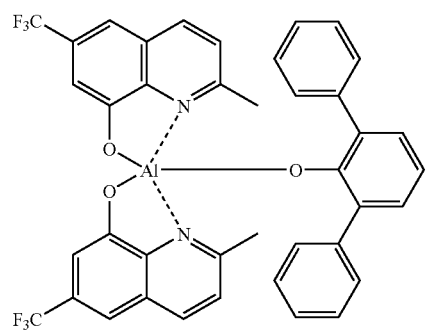

INV-3

-continued
INV-4
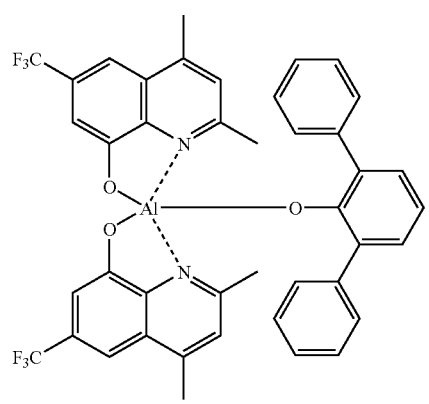
INV-5
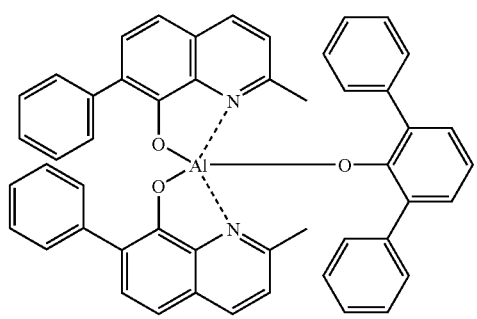
INV-6
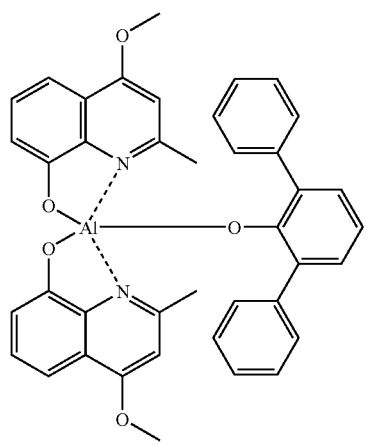
INV-7
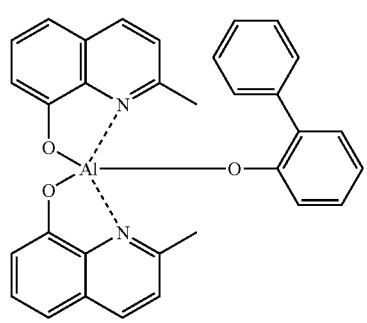
-continued
INV-8
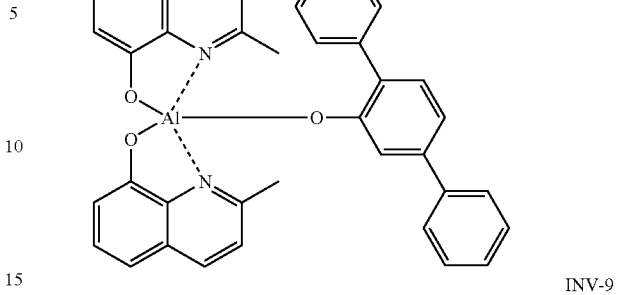
INV-9
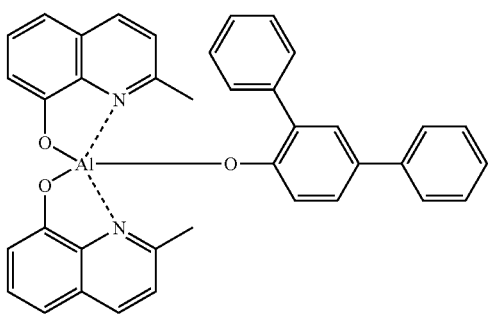
INV-10
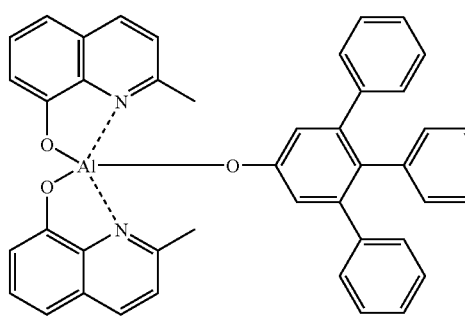
INV-11
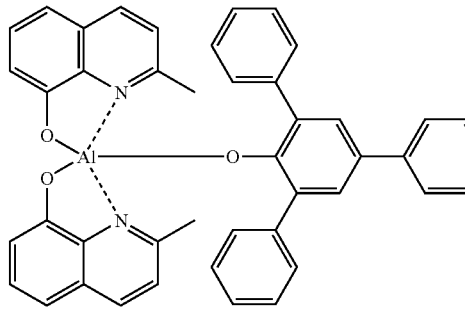
INV-12
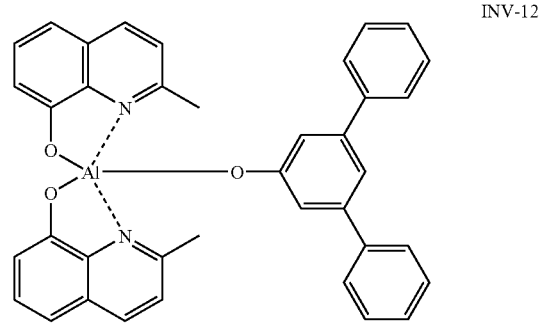

-continued
INV-13
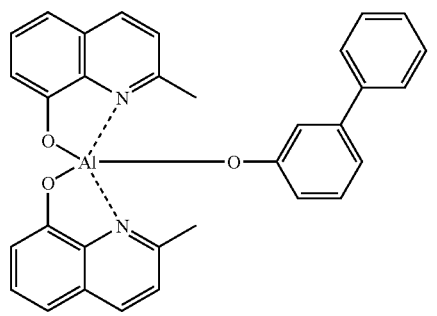
INV-14
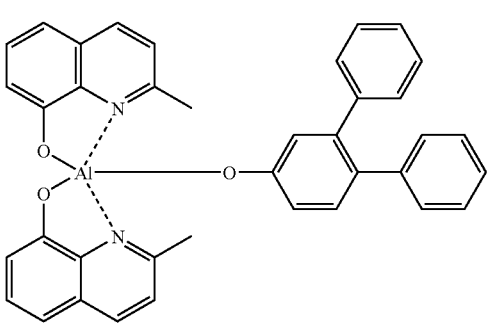
INV-15
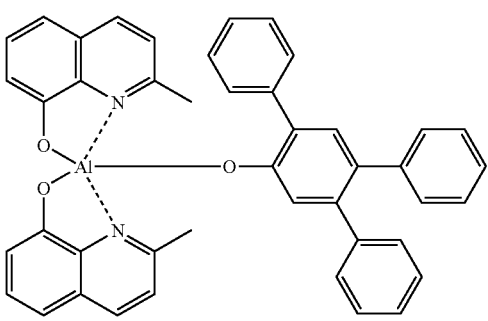
INV-16
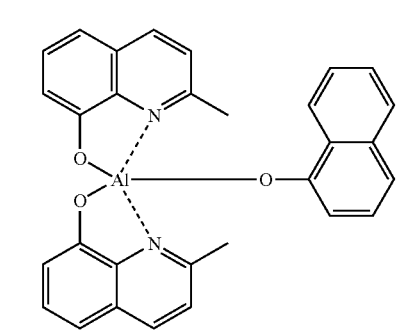
INV-17
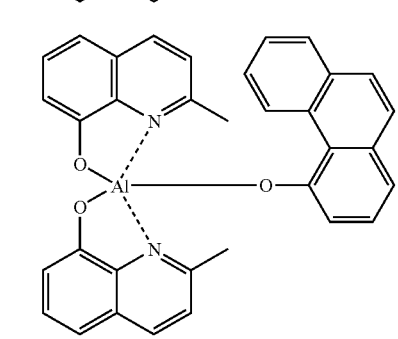
-continued
INV-18
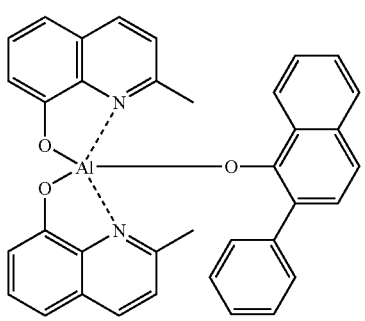
INV-19
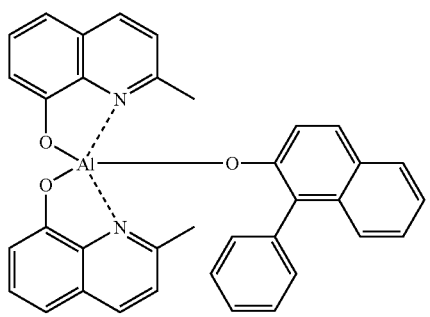
INV-20
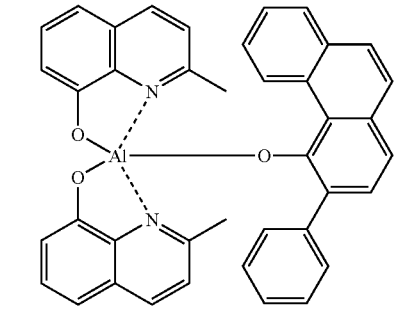
INV-21
INV-22
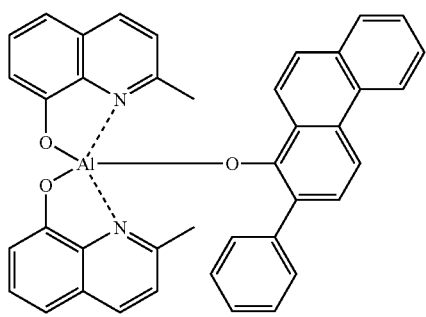

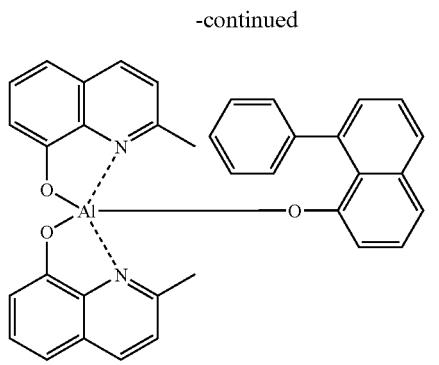

INV-23

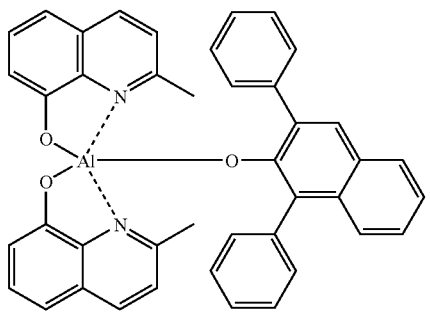

INV-24

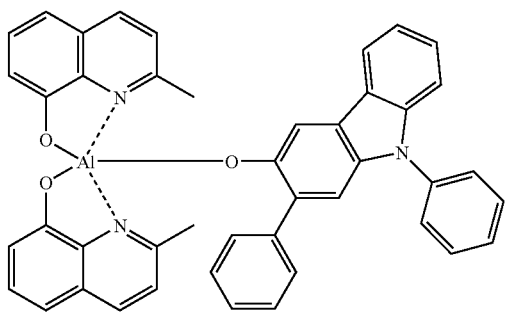

INV-25

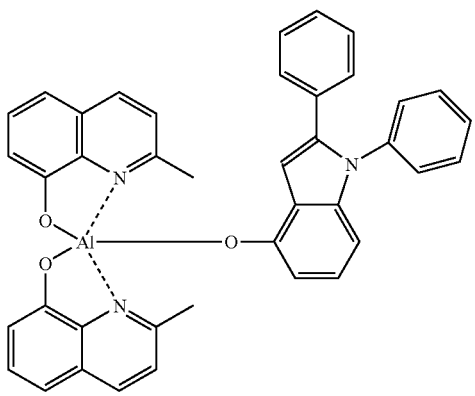

INV-26

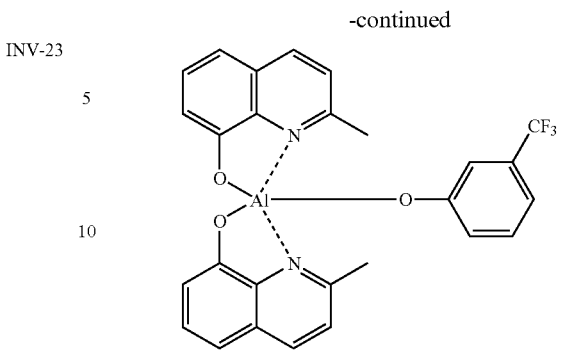

INV-27

Unless otherwise specifically stated, use of the term "substituted" or "substituent" means any group or atom other than hydrogen. Unless otherwise provided, when a group (including a compound or complex) containing a substitutable hydrogen is referred to, it is also intended to encompass not only the unsubstituted form, but also form further substituted derivatives with any substituent group or groups as herein mentioned, so long as the substituent does not destroy properties necessary for utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy)propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron. such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain the desired desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

As stated earlier, it is well within the skill of the art to determine whether a particular group is electron donating or electron accepting. The most common measure of electron donating and accepting properties is in terms of Hammett σ values. Lange's handbook of Chemistry, 12$^{th}$ Ed., McGraw Hill, 1979, Table 3-12, pp. 3-134 to 3-138 lists Hammett σ values for a large number of commonly encountered groups. Hammett σ values are assigned based on phenyl ring substitution, but they provide a practical guide for qualitatively selecting electron donating and accepting groups.

Suitable electron donating groups may be selected from —R', —OR', and —NR'(R") where R' is a hydrocarbon containing up to 6 carbon atoms and R" is hydrogen or R'. Specific examples of electron donating groups include methyl, ethyl, phenyl, methoxy, ethoxy, phenoxy, —N(CH$_3$)$_2$, —N(CH$_2$CH$_3$)$_2$, —NHCH$_3$, —N(C$_6$H$_5$)$_2$, —N(CH$_3$)(C$_6$H$_5$), and —NHC$_6$H$_5$.

Suitable electron accepting groups may be selected from the group consisting of cyano, α-haloalkyl, α-haloalkoxy, amido, sulfonyl, carbonyl, carbonyloxy and oxycarbonyl substituents containing up to 10 carbon atoms. Specific examples include —CN, —F, —CF$_3$, —OCF$_3$, —CONHC$_6$H$_5$, —SO$_2$C$_6$H$_5$, —COC$_6$H$_5$, —CO$_2$C$_6$H$_5$, and —OCOC$_6$H$_5$.

Figure 2:
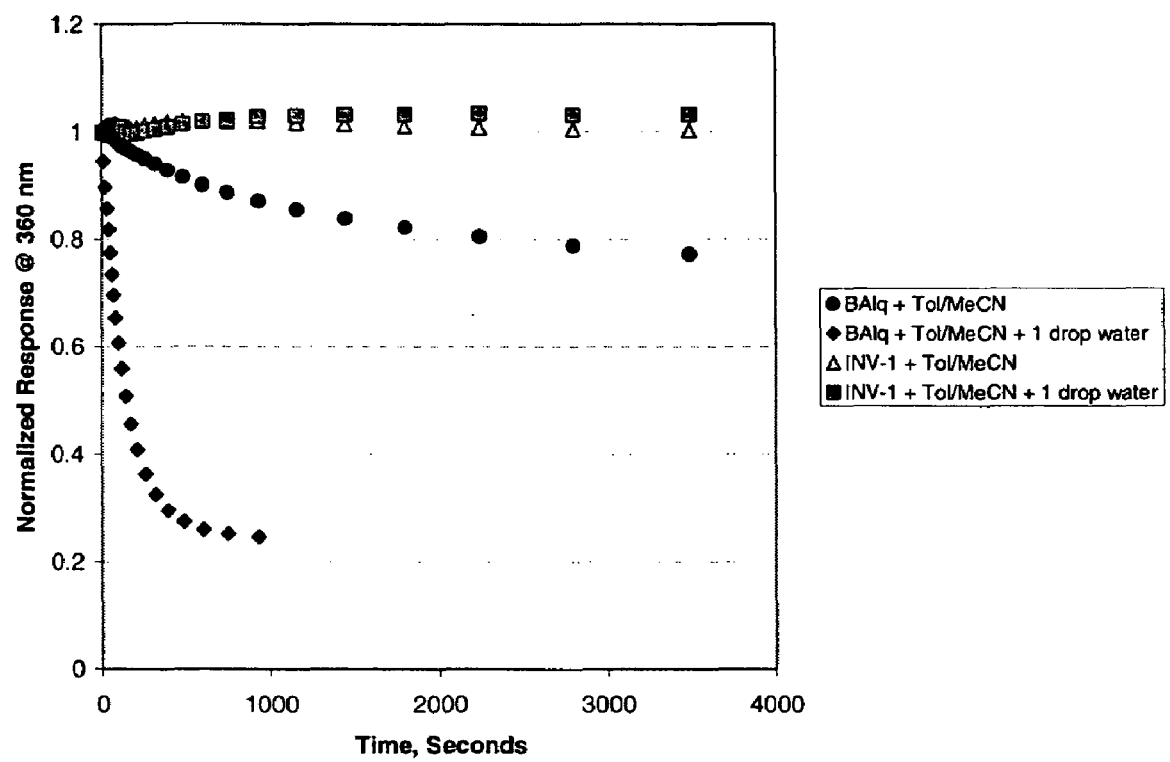
FIG. 2 shows a graph of the UV/Vis Hydrolytic stabilities of BAlq and INV-1

When constructing an OLED it is preferable to work with materials that are stable under a variety of conditions (e.g., atmospheric, thermal) and thereby provide advantages in chemical vapor depositions, storage and operational performance. It is the object of this invention to describe a subset of one class of material, see Formula 1 which, are improved in this regard. In FIG. 2, it is demonstrated that when BAlq is monitored by UV/Vis (360 nm) over time in a mixture of anhydrous toluene and acetonitrile there is some decomposition of the compound. When an identical solution is prepared and monitored following the addition of a drop of water the decomposition is 80% complete within 1000 seconds. Contrasting these results is an identical pair of experiments where BAlq is replaced with IV-1. In both experiments there is essentially no decomposition after 3500 seconds. These results are consistent with observed storage, handling, coating and analysis properties for such sterically congested/Aluminum shielded materials. The unexpected result of this work is that the steric congestion or shielding around the Aluminum center imparts a dramatic improvement in hydrolytic stability.

It is additionally desirable that preferred embodiments have large separations in sublimation, melting and decomposition temperatures, see Table 1. These properties usually facilitate handling and high-quality coating experiments. Such features also make sublimative purification protocols more viable.

The data in Table 1 shows some example thermal characterizations for inventive materials. The measurements were made for each compound under similar conditions for relative comparison purposes. The melting point and decomposition measurements derive from digital scanning calorimetry and the sublimation measurements are from bulk Trane sublimation at 100-1000 mTorr.

TABLE 1

Thermodynamic properties of select inventive materials.
Thermal Data for Inventive Materials

| Compound | Tm (° C.) | Ts (° C.) | Td (° C.) | ΔT (d − s) | ΔT (m − s) | ΔT (d − m) |
|---|---|---|---|---|---|---|
| BAlq | 235 | 210 | 240 | 30 | 25 | 5 |
| INV-1 | 305 | 230 | 315 | 85 | 75 | 10 |
| INV-2 | 287 | 215 | 301 | 86 | 72 | 14 |
| INV-7 | 236 | 215 | 278 | 63 | 21 | 42 |
| INV-8 | 265 | 220 | 304 | 84 | 45 | 39 |

TABLE 1-continued

Thermodynamic properties of select inventive materials.
Thermal Data for Inventive Materials

| Compound | Tm (° C.) | Ts (° C.) | Td (° C.) | ΔT (d − s) | ΔT (m − s) | ΔT (d − m) |
|---|---|---|---|---|---|---|
| INV-16 | 233 | 220 | 282 | 62 | 13 | 49 |
| INV-13 | 197 | 200 | 279 | 79 | −3 | 82 |
| INV-27 | 220 | 215 | 221 | 6 | 5 | 1 |
| INV-19 | 247 | 220 | 287 | 67 | 27 | 40 |

The co-host having hole transporting property may be any suitable hole transporting compound, such as triarylamines or carbazoles, as long it has a triplet energy that is higher than that of the phosphorescent dopant to be employed. The optimum concentration of the hole transporting co-host relative to the electron transporting co-host in the present invention may be determined by experimentation and may be within the range 10 to 60% by weight relative to the aluminum compound co-host, and is often found to be in the range 10 to 30%. The thickness of the hole-transporting layer can be between 10 and about 500 nm and suitably between 50 and 300 nm.

A suitable class of hole-transporting compounds for use as co-host in the present invention are the aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. No. 3,567,450 and U.S. Pat. No. 3,658,520.

A more preferred class of aromatic tertiary amines are those which include at least two aromatic tertiary amine moieties as described in U.S. Pat. No. 4,720,432 and U.S. Pat. No. 5,061,569. Such compounds include those represented by structural formula (A).

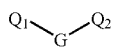
A wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

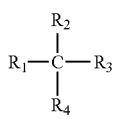
B where
$R_1$ and $R_2$ each independently represents a hydrogen atom, an aryl group, or an alkyl group or $R_1$ and $R_2$ together represent the atoms completing a cycloalkyl group; and
$R_3$ and $R_4$ each independently represents an aryl group, which is in turn substituted with a diaryl substituted amino group, as indicated by structural formula (C):

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by formula (C), linked through an arylene group. Useful tetraaryldiamines include those represented by formula (D).

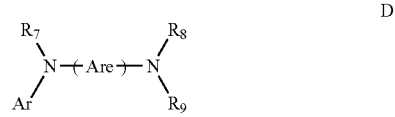
D wherein
each Are is an independently selected arylene group, such as a phenylene or anthracene moiety,
n is an integer of from 1 to 4, and
Ar, $R_7$, $R_8$, and $R_9$ are independently selected aryl groups.
In a typical embodiment, at least one of Ar, $R_7$, $R_8$, and $R_9$ is a polycyclic fused ring structure, e.g., a naphthalene The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting co-host can be formed of a single aromatic tertiary amine compound or a mixture of such compounds. Specifically, one may employ a triarylamine, such as a triarylamine satisfying the formula (B), in combination with a tetraaryldiamine, such as indicated by formula (D). Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
N,N,N',N'-tetraphenyl-4,4'''-diamino-1,1':4',1'':4'',1'''-quaterphenyl
Bis(4-dimethylamino-2-methylphenyl)phenylmethane
1,4-bis[2-[4-[N,N-di(p-tolyl)amino]phenyl]vinyl]benzene (BDTAPVB)
N,N,N',N'-Tetra-p-tolyl-4,4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl (NPB)
4,4'-Bis[N-(1-naphthyl)-N-(2-naphthyl)amino]biphenyl (TNB)
4,4'-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4'-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4''-diamino-p-terphenyl
4,4'-Bis{N-phenyl-N-[4-(1-naphthyl)-phenyl]amino}biphenyl
2,6-Bis[N,N-di(2-naphthyl)amino]fluorene
4,4',4''-tris[(3-methylphenyl)phenylamino]triphenylamine (MTDATA)
4,4'-Bis[N-(3-methylphenyl)-N-phenylamino]biphenyl (TPD)

Another class of useful hole-transporting materials that may be used as co-host includes polycyclic aromatic compounds as described in EP 1 009 041. Tertiary aromatic amines with more than two amine groups may be used, including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Another class of useful hole-transporting materials that may be used as co-host in the present invention includes the carbazoles, for example 4,4'-N,N'-dicarbazole-biphenyl (CBP), 2,2'-dimethyl-4,4'-N,N'-dicarbazole-biphenyl, m-(N,N'-dicarbazole)benzene, and poly(N-vinylcarbazole), 4,4'-bis(carbazol-9-yl)biphenyl (CBP), 4,4'-bis(carbazol-9-yl)-2,2'-dimethyl-biphenyl (CDBP), 1,3-bis(carbazol-9-yl)benzene, 4,4',4''-Tris(carbazol-9-yl)triphenylamine (TCTA).

Phosphorescent Emitter

The light-emitting phosphorescent guest material(s) is typically present in an amount of from 1 to 20 by weight % of the light-emitting layer, and conveniently from 2 to 8% by weight of the light-emitting layer. In some embodiments, the phosphorescent complex guest material(s) may be attached to one or more host materials. The host materials may further be polymers. For convenience, the phosphorescent complex guest material may be referred to herein as a phosphorescent material.

Particularly useful phosphorescent materials are described by Formula 1 below.

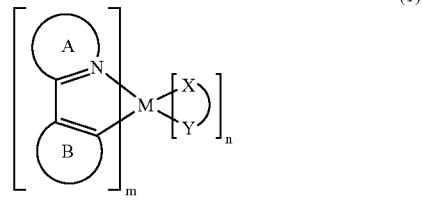

(1)

wherein:

A is a substituted or unsubstituted heterocyclic ring cont at least one N atom;

B is a substituted or unsubstituted aromatic or heteroaromatic ring, or ring containing a vinyl carbon bonded to M;

X—Y is an anionic bidentate ligand;

m is an integer from 1 to 3 and either n in an integer from 0 to 2 such that m+n=3 for M=Rh or Ir;

or m is an integer from 1 to 2 and n in an integer from 0 to 1 such that m+n=2 for M=Pt, Pd.

Compounds according to Formula 1 may be referred to as C,N—, or synonymously, C^N-cyclometallated complexes to indicate that the central metal atom is contained in a cyclic unit formed by bonding the metal atom to carbon and nitrogen atoms of one or more ligands. Examples of heterocyclic ring A in Formula 1 include substituted or unsubstituted pyridine, quinoline, isoquinoline, pyrimidine, indole, indazole, thiazole, and oxazole rings. Examples of ring B in Formula 1 include substituted or unsubstituted phenyl, naphthyl, thienyl, benzothienyl, furanyl rings. Ring B in Formula 1 may also be a N-containing ring such as pyridine, with the proviso that the N-containing ring bonds to M through a C atom as shown in Formula 1 and not the N atom.

An example of a tris-C,N-cyclometallated complex according to Formula 1 with m=3 and n=0 is tris(2-phenyl-pyridinato-N,$C^{2'}$—)Iridium(III), shown below in stereodiagrams as facial (fac-) or meridional (mer-) isomers.

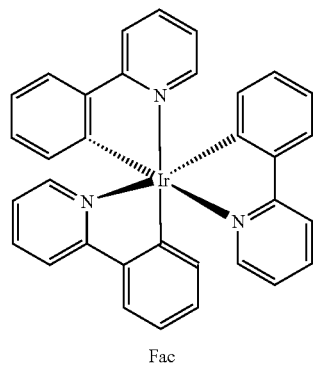

Fac

-continued

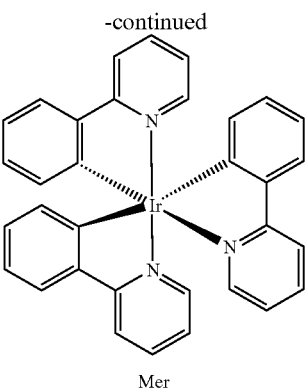

Mer

Generally, facial isomers are preferred since they are often found to have higher phosphorescent quantum yields than the meridional isomers. Additional examples of tris-C,N-cyclometallated phosphorescent materials according to Formula 1 are tris(2-(4'-methylphenyl)pyridinato-N,C$^{2'}$)Iridium(III), tris(3-phenylisoquinolinato-N,C$^{2'}$)Iridium(III), tris(2-phenylquinolinato-N,C$^{2'}$)Iridium(III), tris(1-phenylisoquinolinato-N,C$^{2'}$)Iridium(III), tris(1-(4'-methylphenyl)isoquinolinato-N,C$^{2'}$)Iridium(III), tris(2-(4',6'-difluorophenyl)-pyridinato-N,C$^{2'}$)Iridium(III), tris(2-((5'-phenyl)-phenyl)pyridinato-N,C$^{2'}$)Iridium(III), tris(2-(2'-benzothienyl) pyridinato-N,C$^{3'}$)Iridium(III), tris(2-phenyl-3,3'dimethyl)indolato-N,C$^{2'}$)Ir(III), tris(1-phenyl-1H-indazolato-N,C$^{2'}$)Ir(III).

Tris-C,N-cyclometallated phosphorescent materials also include compounds according to Formula 1 wherein the monoanionic bidentate ligand X—Y is another C,N-cyclometallating ligand. Examples include bis(1-phenylisoquinolinato-N,C$^{2'}$)(2-phenylpyridinato-N,C$^{2'}$)Iridium(III), bis(2-phenylpyridinato-N,C$^{2'}$) (1-phenylisoquinolinato-N,C$^{2'}$) Iridium(III), bis(1-phenylisoquinolinato-N,C$^{2'}$)(2-phenyl-5-methyl-pyridinato-N,C$^{2'}$)Iridium(III), bis(1-phenylisoquinolinato-N,C$^{2'}$)(2-phenyl-4-methyl-pyridinato-N,C$^{2'}$)Iridium(III), and bis(1-phenylisoquinolinato-N,C$^{2'}$)(2-phenyl-3-methyl-pyridinato-N,C$^{2'}$)Iridium(III). Synthesis of such tris-C,N-cyclometallated complexes containing two different C,N-cyclometallating ligands may be conveniently synthesized by the following steps. First, a bis-C,N-cyclometallated diiridium dihalide complex (or analogous dirhodium complex) is made according to the method of Nonoyama (Bull. Chem. Soc. Jpn., 47, 767 (1974)). Secondly, a zinc complex of the second, dissimilar C,N-cyclometallating ligand is prepared by reaction of a zinc halide with a lithium complex or Grignard reagent of the cyclometallating ligand. Third, the thus formed zinc complex of the second C,N-cyclometallating ligand is reacted with the previously obtained bis-C,N-cyclometallated diiridium dihalide complex to form a tris-C,N-cyclometallated complex containing the two different C,N-cyclometallating ligands. Desirably, the thus obtained tris-C,N-cyclometallated complex containing the two different C,N-cyclometallating ligands may be converted to an isomer wherein the C atoms bonded to the metal (e.g. Ir) are all mutually cis by heating in a suitable solvent such as dimethyl sulfoxide.

Structural formulae of some tris-C,N-cyclometallated Iridium complexes are shown below.

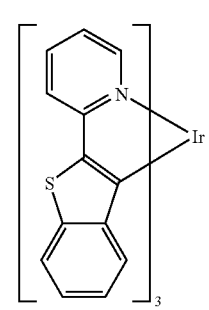

Dopant 1

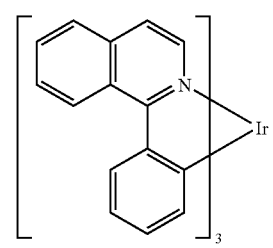

Dopant 2

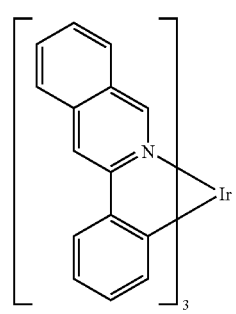

Dopant 3

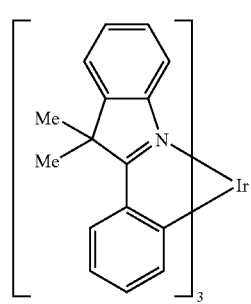

Dopant 4

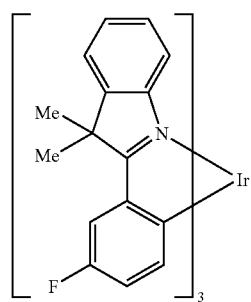

Dopant 5

-continued
Dopant 6
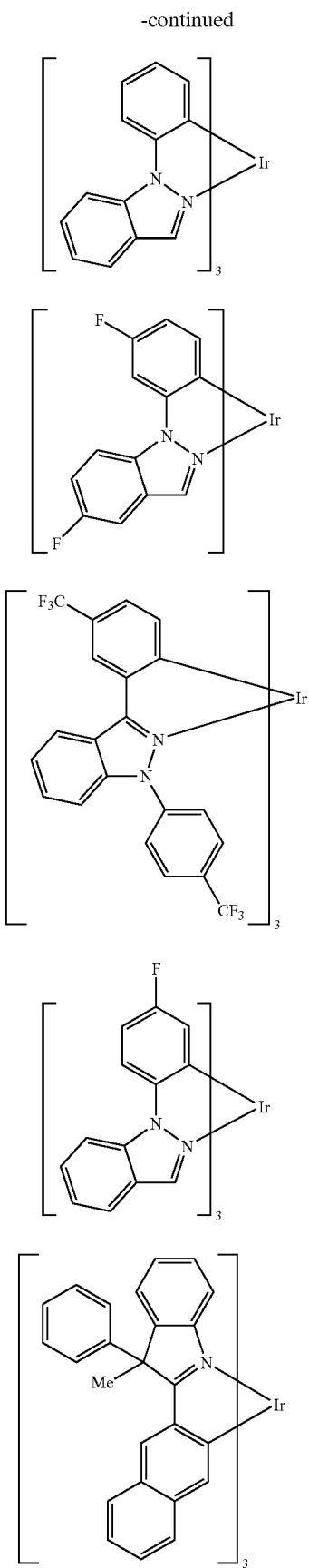
Dopant 7
Dopant 8
Dopant 9
Dopant 10
-continued
Dopant 11
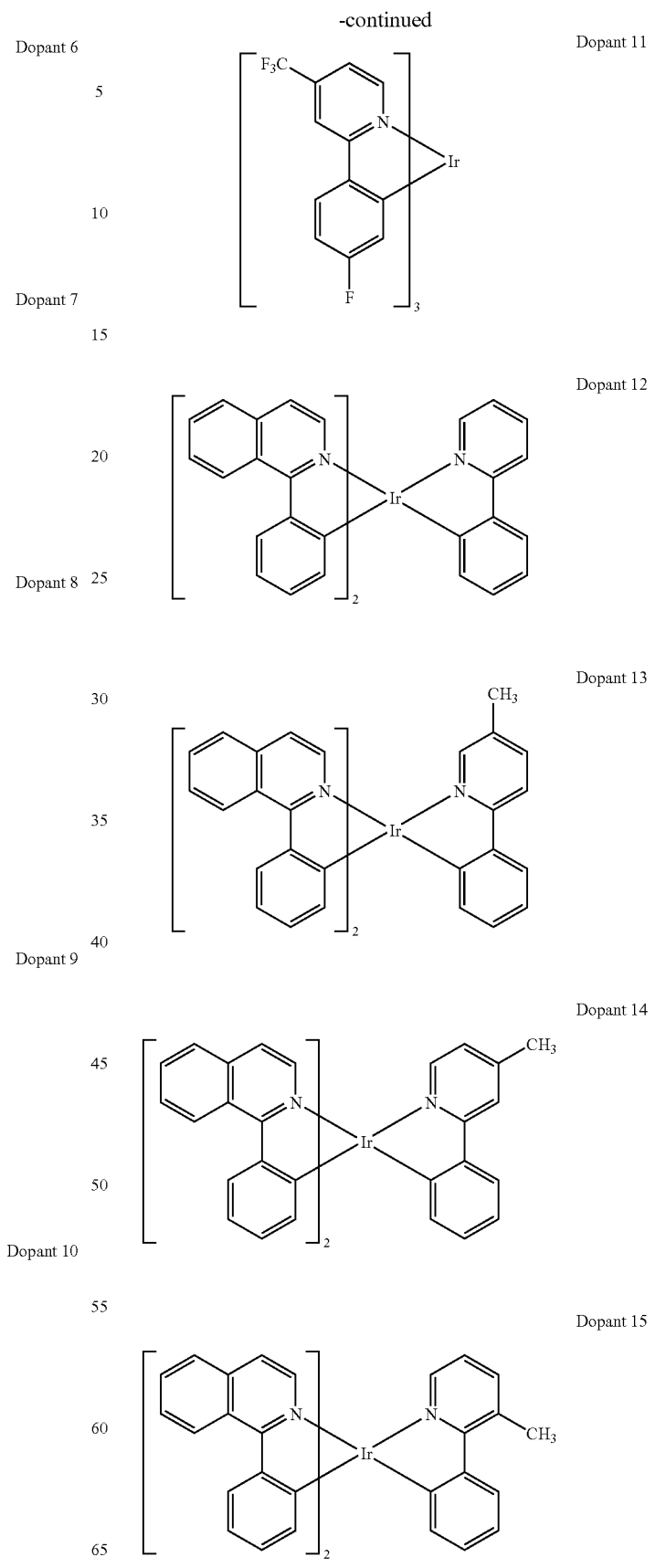
Dopant 12
Dopant 13
Dopant 14
Dopant 15

Suitable phosphorescent materials according to Formula 1 may in addition to the C,N-cyclometallating ligand(s) also contain monoanionic bidentate ligand(s) X—Y that are not C,N-cyclometallating. Common examples are beta-diketonates such as acetylacetonate, and Schiff bases such as picolinate. Examples of such mixed ligand complexes according to Formula 1 include bis(2-phenylpyridinato-N,C$^{2'}$)Iridium(III)(acetylacetonate), bis(2-(2'-benzothienyl)pyridinato-N,C$^{3'}$)Iridium(III)(acetylacetonate), and bis(2-(4',6'-difluorophenyl)-pyridinato-N,C$^{2'}$)Iridium(III)(picolinate).

Other important phosphorescent materials according to Formula 1 include C,N-cyclometallated Pt(II) complexes such as cis-bis(2-phenylpyridinato-N,C$^{2'}$)platinum(II), cis-bis(2-(2'-thienyl)pyridinato-N,C$^{3'}$)platinum(II), cis-bis(2-(2'-thienyl)quinolinato-N,C$^{5'}$)platinum(II), or (2-(4',6'-difluorophenyl)pyridinato-N,C$^{2'}$)platinum (II) (acetylacetonate).

In addition to bidentate C,N-cyclometallating complexes represented by Formula 1, many suitable phosphorescent emitters contain multidentate C,N-cyclometallating ligands. Phosphorescent emitters having tridentate ligands suitable for use in the present invention are disclosed in U.S. Pat. No. 6,824,895 B1 and U.S. Ser. No. 10/729,238 (pending) and references therein, incorporated in their entirety herein by reference. Phosphorescent emitters having tetradentate ligands suitable for use in the present invention are described by the following formulae:

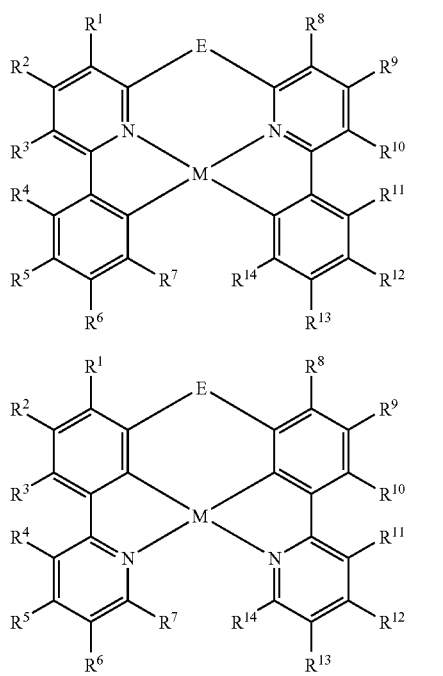

wherein:
M is Pt or Pd;
R$^1$-R$^7$ represent hydrogen or independently selected substituents, provided that R$^1$ and R$^2$, R$^2$ and R$^3$, R$^3$ and R$^4$, R$^4$ and R$^5$, R$^5$ and R$^6$, as well as R$^6$ and R$^7$ may join to form a ring group;

R$^8$-R$^{14}$ represent hydrogen or independently selected substituents, provided that R$^8$ and R$^9$, R$^9$ and R$^{10}$, R$^{10}$ and R$^{11}$, R$^{11}$ and R$^{12}$, R$^{12}$ and R$^{13}$, as well as R$^{13}$ and R$^{14}$ may join to form a ring group;

E represents a bridging group selected from the following:

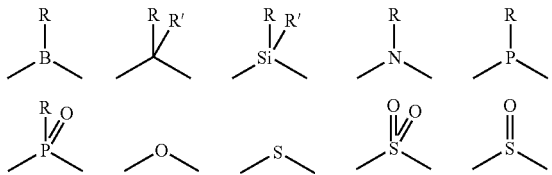

wherein R and R' represent hydrogen or independently selected substituents;

provided R and R' may combine to form a ring group.

In one desirable embodiment, the tetradentate C,N-cyclometallated phosphorescent emitter suitable for use in the present invention is represented by the following formula:

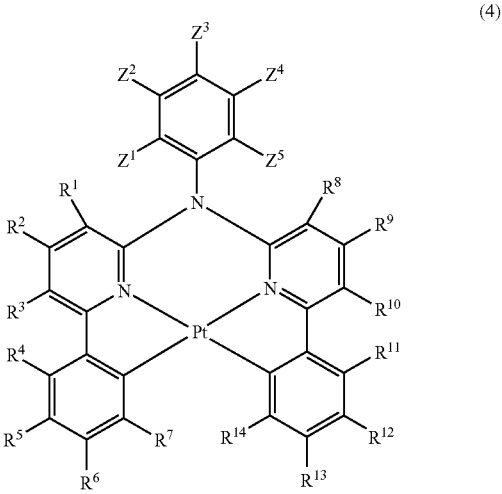

wherein,
R$^1$-R$^7$ represent hydrogen or independently selected substituents, provided that R$^1$ and R$^2$, R$^2$ and R$^3$, R$^3$ and R$^4$, R$^4$ and R$^5$, R$^5$ and R$^6$, as well as R$^6$ and R$^7$ may combine to form a ring group;

R$^8$-R$^{14}$ represent hydrogen or independently selected substituents, provided that R$^8$ and R$^9$, R$^9$ and R$^{10}$, R$^{11}$ and R$^{11}$, and R$^{12}$, R$^{12}$ and R$^{13}$, as well as R$^{13}$ and R$^{14}$ may combine to form a ring group;

Z$^1$-Z$^5$ represent hydrogen or independently selected substituents, provided that Z$^1$ and Z$^2$, Z$^2$ and Z$^3$, Z$^3$ and Z$^4$, as well as Z$^4$ and Z$^5$ may combine to form a ring group.

Specific examples of phosphorescent emitters having tetradentate C,N-cyclometallating ligands suitable for use in the present invention include compounds X, Y, and Z represented below.

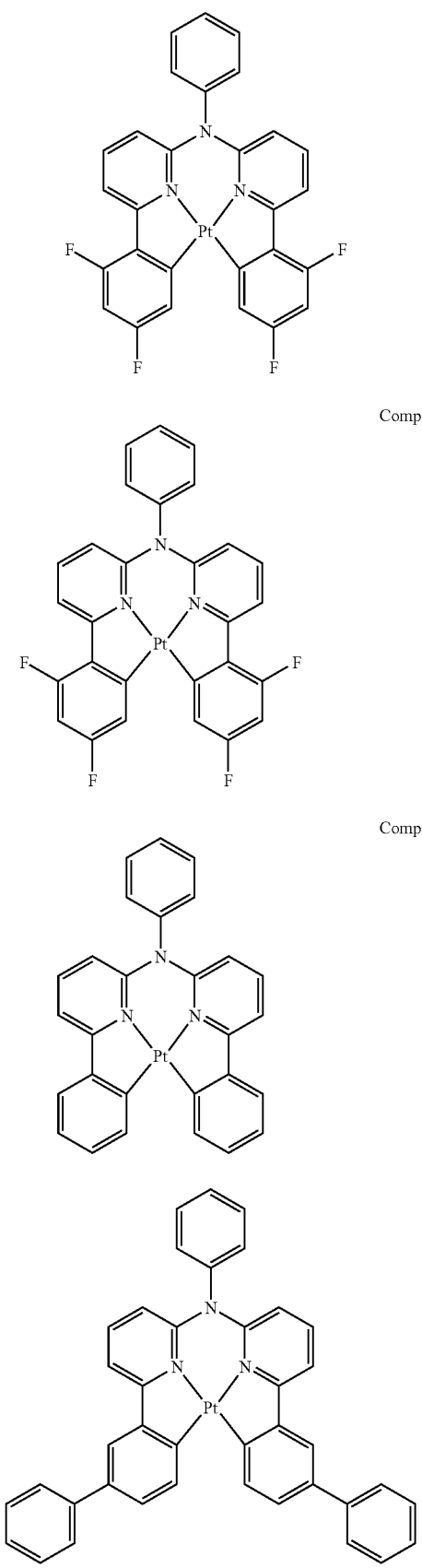

Compound X

Compound Y

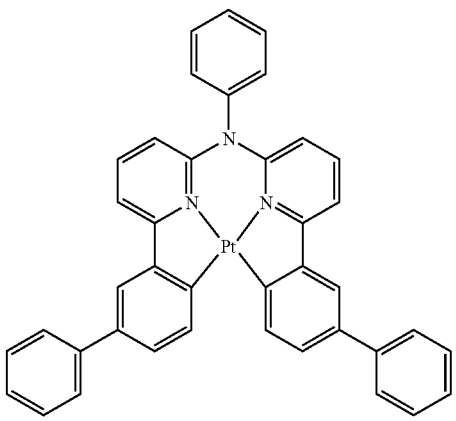

Compound Z

Phosphorescent emitters having tetradentate C,N-cyclometallating ligands may be synthesized by reacting the tetradentate C,N-cyclometallating ligand with a salt of the desired metal, such as $K_2PtCl_4$, in a proper organic solvent such as glacial acetic acid to form the phosphorescent emitter having tetradentate C,N-cyclometallating ligands. A tetraakylammonium salt such as tetrabutylammonium chloride can be used as a phase transfer catalyst to accelerate the reaction.

The emission wavelengths (color) of C,N-cyclometallated phosphorescent materials according to Formulae 1 thru 4 are governed principally by the lowest energy optical transition of the complex and hence by the choice of the C,N-cyclometallating ligand. For example, 2-phenyl-pyridinato-N,$C^{2'}$ complexes are typically green emissive while 1-phenyl-isoquinolinolato-N,$C^{2'}$ complexes are typically red emissive. In the case of complexes having more than one C,N-cyclometallating ligand, the emission will be that of the ligand having the property of longest wavelength emission. Emission wavelengths may be further shifted by the effects of substituent groups on the C,N-cyclometallating ligands. For example, substitution of electron donating groups at appropriate positions on the N-containing ring A or electron withdrawing groups on the C-containing ring B tend to blue-shift the emission relative to the unsubstituted C,N-cyclometallated ligand complex. Selecting a monodentate anionic ligand X,Y in Formula 1 having more electron withdrawing properties also tends to blue-shift the emission of a C,N-cyclometallated ligand complex. Examples of complexes having both monoanionic bidentate ligands possessing electron-withdrawing properties and electron-withdrawing substituent groups on the C-containing ring B include bis(2-(4',6'-difluorophenyl)-pyridinato-N,$C^{2'}$)iridium(III)(picolinate) and bis(2-(4',6'-difluorophenyl)-pyridinato-N,$C^{2'}$)iridium(III)(tetrakis(1-pyrazolyl)borate).

The central metal atom in phosphorescent materials according to Formula 1 may be Rh or Ir for (m+n=3) and Pd or Pt (m+n=2). Preferred metal atoms are Ir and Pt since these tend to give higher phosphorescent quantum efficiencies according to the stronger spin-orbit coupling interactions generally obtained with elements in the third transition series.

Other phosphorescent materials that do not involve C,N-cyclometallating ligands are known. Phosphorescent complexes of Pt(II), Ir(I), and Rh(I) with maleonitriledithiolate have been reported (C. E. Johnson et al, J. Am. Chem. Soc., 105,1795-1802 (1983)). Re(I) tricarbonyl diimine complexes are also known to be highly phosphorescent (M. Wrighton and D. L. Morse, J. Am. Chem. Soc., 96,998-1003 (1974); D. J. Stufkens, Comments Inorg. Chem., 13,359-385 (1992); V. W. W. Yam, Chem. Commun., 2001, 789-796)). Os(II) complexes containing a combination of ligands including cyano ligands and bipyridyl or phenanthroline ligands have also been demonstrated in a polymer OLED (Y. Ma et al, Synthetic Metals, 94, 245-248 (1998)).

Porphyrin complexes such-as 2,3,7,8,12,13,17,18-octaethyl-21H, 23H-porphine platinum(II) are also useful phosphorescent materials.

Still other examples of useful phosphorescent materials include coordination complexes of the trivalent lanthanides such as $Tb^{3+}$ and $Eu^{3+}$ (J. Kido et al., Chem Lett., 657 (1990); J Alloys and Compounds, 192, 30-33 (1993); Jpn J Appl Phys, 35, L394-6 (1996) and *Appl. Phys. Lett.,* 65, 2124 (1994)).

Additional information on suitable phosphorescent materials and synthetic methods, incorporated herein by reference, can be found in U.S. Pat. No. 6,303,238 B1, WO 00/57676, WO 00/70655, WO 01/41512 A1, US 2002/0182441 A1, US 2003/0017361 A1, US 2003/0072964 A1, U.S. Pat. No. 6,413,656 B1, U.S. Pat. No. 6,687,266 B1, US 2004/0086743 A1, US 2004/0121184 A1, US 2003/0059646 A1, US 2003/0054198 A1, EP 1 239 526 A2, EP 1 238 981 A2, EP 1 244 155 A2, US 2002/0100906 A1, US 2003/0068526 A1, US 2003/0068535 A1, JP 2003073387A, JP 2003 073388A, U.S. Pat. No. 6,677,060 B2, US 2003/0235712 A1, US 2004/0013905 A1, U.S. Pat. No. 6,733,905 B2, U.S. Pat. No. 6,780,528 B2, US 2003/0040627 A1, JP 2003059667A, JP 2003073665A, US 2002/0121638 A1, EP 1371708A1, US 2003/010877 A1, WO 03/040256 A2, US 2003/0096138 A1, US 2003/0173896 A1, U.S. Pat. No. 6,670645 B2, US 2004/0068132 A1, WO 2004/015025 A1, US 2004/0072018 A1, US 2002/0134984 A1, WO 03/079737 A2, WO 2004/020448 A1, WO 03/091355 A2, U.S. Ser. No. 10/729,402, U.S. Ser. No. 10/729,712, U.S. Ser. No. 10/729,738, U.S. Ser. No. 10/729,238, U.S. Pat. No. 6,824,895 B1, U.S. Ser. No. 10/729,207, and U.S. Ser. No. 10/729,263.

Suitable Embodiment

The phosphorescent dopant is suitably selected to be a tris-C^N-cyclometallated Iridium complex. Here the term "C^N-cyclometallated" describes bidentate ligands that bond to the central metal atom (i.e., Iridium) through a metal-carbon bond and through coordination to a nitrogen atom. The compounds having three C^N-cyclometallating ligands provide higher device operational stability than compounds having only two C^N-cyclometallating ligands and the remaining coordinating sites occupied by other types of ancillary ligands, such as acetylacetonate or a Schiff base such as the deprotonated from of picolinic acid. The tris-C^N-cyclometallated Iridium complexes may be facial or meridional isomers. The facial isomers are usually preferred since they are often found to have higher emission quantum yield than meridional isomers. One example of a tris-C^N-cyclometallated Iridium complex is tris(2-phenyl-pyridinato-N^C—)Iridium(III), shown below in stereodiagrams as facial (fac-) or meridional (mer-) isomers, described previously.

These tris-C^N-cyclometallated Iridium may be synthesized according to literature methods or by reacting an iridium halide complex with a silver salt and excess organic cyclometallating ligand in a diol solvent.

Particularly useful ligands for the tris-C^N-cyclometallated Iridium complexes of the present invention are substituted or unsubstituted 2-phenyl quinolines, 1-phenyl isoquinolines, and 3-phenyl isoquinolines.

The tris-C^N-cyclometallated iridium complexes give superior performance over certain alternative groups of phosphorescent dopants including platinum porphyrin complexes, such as 2,3,7,8,12,13,17,18-octaethyl-21H,23H-porhine platinum(II), and platinum C^N-cyclometallated complexes since the platinum complexes exhibit a strong tendency to interact with each other or to aggregate as a function of concentration in the host material, leading to variable emissive properties. The tris-C^N-cyclometallated iridium complexes also generally provide superior quantum yields for emission and short emission lifetimes.

General Device Architecture

The present invention can be employed in many OLED device configurations using small molecule materials, oligomeric materials, polymeric materials, or combinations thereof. These range from very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. The essential requirements of an OLED are an anode, a cathode, and an organic light-emitting layer located between the anode and cathode. Additional layers may be employed as more fully described hereafter.

According to the present invention, an especially useful arrangement for a small molecule device is comprised of a substrate, an anode, a hole-injecting layer, a hole-transporting layer, a light-emitting layer, a hole-blocking layer, an electron-transporting layer, and a cathode. These layers are described in detail below. Note that the substrate may alternatively be located adjacent to the cathode, or the substrate may actually constitute the anode or cathode. The organic layers between the anode and cathode are conveniently referred to as the organic EL element. Also, the total combined thickness of the organic layers is desirably less than 500 nm.

A typical structure, especially useful for of a small molecule device, is shown in FIG. 1 and is comprised of a substrate 101, an anode 103, a hole-injecting layer 105, a hole-transporting layer 107, a light-emitting layer 109, an exciton or a hole blocking layer 110, an electron-transporting layer 111, and a cathode 113. These layers are described in detail below. Note that the substrate may alternatively be located adjacent to the cathode, or the substrate may actually constitute the anode or cathode. The organic layers between the anode and cathode are conveniently referred to as the organic EL element. Also, the total combined thickness of the organic layers is desirably less than 500 nm.

The anode and cathode of the OLED are connected to a voltage/current source through electrical conductors. The OLED is operated by applying a potential between the anode and cathode such that the anode is at a more positive potential than the cathode. Holes are injected into the organic EL element from the anode and electrons are injected into the organic EL element from the cathode. Enhanced device stability can sometimes be achieved when the OLED is operated in an AC mode where, for some time period in the AC cycle, the potential bias is reversed and no current flows. An example of an AC driven OLED is described in U.S. Pat. No. 5,552,678.

This invention may be used in so-called stacked device architecture, for example, as taught in U.S. Pat. No. 5,703,436 and U.S. Pat. No. 6,337,492.

Substrate

The OLED device of this invention is typically provided over a supporting substrate where either the cathode or anode can be in contact with the substrate. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. The substrate can be a complex structure comprising multiple layers of materials. This is typically the case for active matrix substrates wherein TFTs are provided below the OLED layers. It is still necessary that the substrate, at least in the emissive pixilated areas, be comprised of largely transparent materials such as glass or polymers. For applications where the EL emission is viewed through the top electrode, the transmissive characteristic of the bottom support is immaterial, and therefore the substrate can be light transmissive, light absorbing or light reflective. Substrates for use in this case include, but are not limited to, glass, plastic, semiconductor materials, such as silicon, ceramics, and circuit board materials. Again, the substrate can be a complex structure comprising multiple layers of materials such as found in active matrix TFT designs. It is necessary to provide in these device configurations a light-transparent top electrode.

Anode

When the desired electroluminescent light emission (EL) is viewed through the anode, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode, the transmissive characteristics of the anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize short circuits or enhance reflectivity.

Cathode

When light emission is viewed solely through the anode, the cathode used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One useful cathode material is comprised of a Mg:Ag alloy wherein the percentage of silver is in the range of 1 to 20%, as described in U.S. Pat. No. 4,885,221. Another suitable class of cathode materials includes bilayers comprising the cathode and a thin electron-injection layer (EIL) in contact with an organic layer (e.g., an electron transporting layer (ETL)), the cathode being capped with a thicker layer of a conductive metal. Here, the EIL preferably includes a low work function metal or a salt of a low-work-function metal, and if so, the thicker capping layer does not need to have a low work function. One such cathode is comprised of a thin layer of LiF followed by a thicker layer of Al as described in U.S. Pat. No. 5,677,572. An ETL material doped with an alkali metal, for example, Li-doped Alq, is another example of a useful EIL. Other useful cathode material sets include, but are not limited to, those disclosed in U.S. Pat. Nos. 5,059,861, 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211, 5,247,190, JP 3,234,963, 5,703, 436, 5,608,287, 5,837,391, 5,677,572, 5,776,622, 5,776,623, 5,714,838, 5,969,474, 5,739,545, 5,981,306, 6,137,223, 6,140,763, 6,172,459, EP 1 076 368, 6,278,236, and 6,284, 3936. Cathode materials are typically deposited by any suitable method such as evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Hole Injecting Layer

A hole-injecting layer may be provided between anode and hole-transporting layer. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,208, 075, and some aromatic amines, for example, m-MTDATA (4,4',4"-tris[(3-methylphenyl)phenylamino]triphenylamine). Alternative hole-injecting materials reportedly useful in organic EL devices are described in EP 0 891 121 A1 and EP 1 029 909 A1. A hole-injection layer is conveniently used in the present invention, and is desirably a plasma-deposited fluorocarbon polymer. The thickness of a hole-injection layer containing a plasma-deposited fluorocarbon polymer can be in the range of 0.2 to 200 and suitably in the range of 0.3 to 1.5 nm.

Electron Transporting Layer.

Similarly, it is usually advantageous to have an electron transporting layer deposited between the cathode and the emissive layer. The co-host in the emissive layer having electron transporting property may be the same or different from an electron transporting material deposited in said electron transporting layer between the anode and the light emitting layer. The electron transporting layer may include more than one electron transporting compound, deposited as a blend or divided into separate layers.

Preferred thin film-forming materials for use in constructing the electron-transporting layer of the organic EL devices of this invention are metal-chelated oxinoid compounds, including chelates of oxine itself (also commonly referred to as 8-quinolinol or 8-hydroxyquinoline). Such compounds help to inject and transport electrons, exhibiting high levels of performance, and are readily fabricated in the form of thin films. Exemplary of contemplated oxinoid compounds are those satisfying structural formula (E) below.

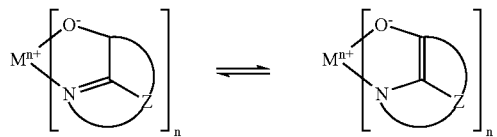

wherein
M represents a metal;
n is an integer of from 1 to 4; and
Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:
CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-µ-oxo-bis(2-methyl-8-quinolinolato)aluminum(III)
CO-5: Indium trisoxine [alias, tris(8-quinolinolato)indium]
CO-6: Aluminum tris(5-methyloxine) [alias, tris(5-methyl-8-quinolinolato)aluminum(II)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)]

Other electron transporting materials suitable for use in the electron transporting layer are the aluminum complexes described by Formula 1 above, which are also the compounds employed as co-hosts in the present invention.

Other electron-transporting materials suitable for use in the electron-transporting layer include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials. Triazines and oxadiazoles are also known to be useful as electron transporting materials.

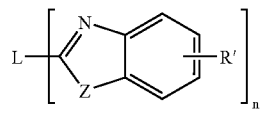

Where:
n is an integer of 3 to 8;
Z is O, NR or S; and
R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and
L is a linkage unit consisting of alkyl, aryl, substituted alkyl, or substituted aryl, which conjugately or unconjugately connects the multiple benzazoles together. An example of a useful benzazole is 2,2',2"-(1,3,5-phenylene)tris[1-phenyl-1H-benzimidazole] (TPBI) shown below and disclosed in Shi et al U.S. Pat. No. 5,766,779.

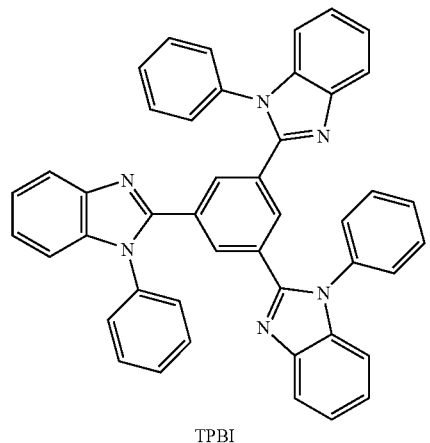

TPBI

The electron transporting layer or a portion of the electron transporting layer adjacent the cathode may further be doped with an alkali metal to reduce electron injection barriers and hence lower the drive voltage of the device. Suitable alkali metals for this purpose include lithium and cesium.

If both a hole-blocking layer and an electron-transporting layer are used, electrons should pass readily from the electron-transporting layer into the hole-blocking layer. Therefore, the electron affinity of the electron-transporting layer should not greatly exceed that of the hole-blocking layer. Preferably, the electron affinity of the electron-transporting layer should be less than that of the hole-blocking layer or not exceed it by more than about 0.2 eV. If an electron-transporting layer is used, its thickness may be between 2 and 100 nm and preferably between 5 and 50 nm.

Blocking Layers

In addition to suitable co-hosts and transporting materials, an OLED device according to the invention may also include at least one hole or electron blocking layers and/or exciton blocking layers to help confine the excitons or electron-hole recombination centers to the light-emitting layer comprising the co-hosts and phosphorescent material. In one embodiment, such a blocking layer would be placed between the electron-transporting layer and the light-emitting layer. In this case, the ionization potential of the blocking layer should be such that there is an energy barrier for hole migration from the host into the electron-transporting layer, while the electron affinity should be such that electrons pass more readily from the electron-transporting layer into the light-emitting layer comprising host and phosphorescent material. It is further desired, but not absolutely required, that the triplet energy of the blocking material be greater than that of the phosphorescent material. Suitable hole-blocking materials are described in WO 00/70655A2 and WO 01/93642 A1. Two examples of useful materials are bathocuproine (BCP) and bis(2-methyl-8-quinolinolato)(4-phenylphenolato)Aluminum(III) (BAlq). Additional aluminum complexes represented by Formula 1 above may also serve as useful blocking layers between the electron transporting layer and the light emitting layer. Other metal complexes useful as blocking layers are described in US 20030068528. US 20030175553 A1 describes the use of fac-tris(1-phenylpyrazolato-N,C 2)iridium(III) (Irppz) in an electron/exciton blocking layer deposited between the hole transporting layer and the light emitting layer. When a blocking layer is used, its thickness can be between 2 and 100 nm and preferably between 5 and 10 nm.

The organic materials mentioned above are suitably deposited by any means suitable for the form of the organic materials. In the case of small molecules, they are conveniently deposited through sublimation or evaporation, but can be deposited by other means such as coating from a solvent together with an optional binder to improve film formation. If the material is a polymer, coating from a solvent is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be-achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357) or an inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as $SiO_2$, Teflon, and alternating inorganic/polymeric layers are known in the art for encapsulation. Any of these methods of sealing or encapsulation and desiccation can be used with the OLEDs constructed according to the present invention.

Optical Optimization

OLED devices of this invention can employ various well-known optical effects in order to enhance their emissive properties if desired. Included are optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color-conversion filters over the display. Filters, polarizers, and anti-glare or anti-reflection coatings may be specifically provided over the cover or as part of the cover.

Other Useful Organic Layers and Device Architecture

An OLED device employing a phosphorescent material can include an exciton-blocking layer, placed adjacent to light-emitting layer 109 on the anode side, to help confine electron-hole recombination events and the resulting excitons to the light-emitting layer 109 comprising the host and phosphorescent material. An exciton-blocking layer can comprise certain hole-transporting materials as described by Kondakova and Young in attorney copending Docket 87230AEK, incorporated herein by reference.

In some instances, layers 109 through 111 can optionally be collapsed into a single layer that serves the function of supporting both light emission and electron transportation. Layers 110 and 111 may also be collapsed into a single layer that functions to block holes or excitons, and supports electron transport. It also known in the art that emitting materials may be included in the hole-transporting layer 107. In that case, the hole-transporting material may serve as a host. Multiple materials may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, US 20020025419, EP 1 182 244, U.S. Pat. No. 5,683,823, U.S. Pat. No. 5,503,910, U.S. Pat. No. 5,405,709, and U.S. Pat. No. 5,283,182 and can be equipped with a suitable filter arrangement to produce a color emission.

This invention may be used in so-called stacked device architecture, for example, as taught in U.S. Pat. No. 5,703,436 and U.S. Pat. No. 6,337,492.

Deposition of Organic Layers

The organic materials mentioned above are suitably deposited by any means suitable for the form of the organic materials. In the case of small molecules, they are conveniently deposited through sublimation or evaporation, but can be deposited by other means such as coating from a solvent together with an optional binder to improve film formation. If the material is a polymer, coating from a solvent is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294, 870), spatially-defined thermal dye transfer from a donor sheet (U.S. Pat. No. 5,688,551, U.S. Pat. No. 5,851,709 and U.S. Pat. No. 6,066,357) or an inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as $SiO_x$, Teflon, and alternating inorganic/polymeric layers are known in the art for encapsulation. Any of these methods of sealing or encapsulation and desiccation can be used with the OLEDs constructed according to the present invention.

Optical Optimization

OLED devices of this invention can employ various well-known optical effects in order to enhance their emissive properties if desired. Included are optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color-conversion filters over the display. Filters, polarizers, and anti-glare or anti-reflection coatings may be specifically provided over the cover or as part of the cover.

Embodiments of the invention can provide advantageous features such as higher luminous yield and power efficiency. Embodiments of the organometallic compounds useful in the invention can provide a wide range of hues including those useful in the emission of white light (directly or through filters to provide multicolor displays).

The invention and its advantages can be better appreciated by the following examples.

EXAMPLES

Example 1

Determination of Triplet Energies

Normally, the fluorescence emission from singlet excited state dominates the emission spectra of aluminum oxinoid compounds at room temperature. However, the phosphorescence emission spectrum from the triplet excited state may be time-resolved from the fluorescence spectrum by the delayed luminescence technique since the fluorescence lifetimes are usually on the order of 1 to 10 nsec, while phosphorescence lifetimes are considerably longer. The phosphorescent emission is usually very low in quantum yield, and is best observed at low temperatures with very sensitive detection. The triplet energy is then taken from the high-energy origin of the phosphorescence spectrum. The table below contains the triplet energies determined for a number of aluminum oxinoid complexes by the delayed luminescence technique at 7 K in a frozen mixture of iodobenzene.

TABLE 2

Typical Triplet Energies for Inventive Examples.

| Compound | Eg(T), eV |
|---|---|
| BAlq | 2.36 |
| Inv-1 | 2.37 |
| Inv-2 | 2.46 |
| Inv-7 | 2.36 |
| Inv-8 | 2.46 |
| ALQ | 2.19 |

From Table 2, it is seen that the aluminum bis-(2-substituted)oxinoid compounds bearing a third ligand comprising an aromatic-oxy group possess higher triplet energies than Alq. Furthermore, it is seen that selecting the 2-substituted oxinoid ligand and the aromatic-oxy group as in Compounds Inv-7 and Inv-8 can provide still higher triplet energies than those of the other compounds.

Example 2

A Co-Host of Inv-1 and NPB with Dopant 2

EL devices satisfying the requirements of the invention were constructed in the following manner:

A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon (CFx) hole-injecting layer (HIL) by plasma-assisted deposition of $CHF_3$.

b) A hole-transporting layer (HTL) of N,N'-di-1-naphthalenyl-N,N'-diphenyl-4,4'-diaminobiphenyl (NPB) having a thickness of 150 nm was then evaporated from a tantalum boat.

c) A 35 nm LEL comprised of the co-hosts (INV-1 and NPB (15 wt %) electroluminescent component, Dopant 2, (6 and 8 wt %, respectively) were then deposited onto the hole-transporting layer. These materials were also evaporated from graphite boats.

d) A 10 nm hole blocking layer of INV-1 was deposited onto the LEL. These materials were also evaporated from graphite boat.

d) A 40 nm electron-transporting layer (ETL) of tris(8-quinolinolato)aluminum (III) ($Alq_3$) was then deposited onto the light-emitting layer. This material was also evaporated from a graphite boat.

e) On top of the $Alq_3$ layer was deposited a 220 nm cathode formed of a 10:1 volume ratio of Mg and Ag.

The above sequence completed the deposition of the EL device. The device was then hermetically packaged in a dry glove box for protection against ambient environment.

The cells thus formed were tested for efficiency (in the form of luminance yield), color, drive voltage and the results are listed in Table 3.

TABLE 3

Evaluation of the Inv-1 as a component of a co-host in the LEL.

| Sample | INV-1 Wt % | NPB Wt % | Dopant 2 Wt % | Color CIEx, y* | Efficiency (cd/A)* | Drive Voltage (V)* | % Efficiency Increase vs Comp-1 | % Drive Voltage Decrease vs Comp-1 |
|---|---|---|---|---|---|---|---|---|
| Comp-1 | 92 | 0 | 8 | 0.671, 0.328 | 5.69 | 13.3 | — | — |
| Inv Ex-1 | 81 | 15 | 6 | 0.661, 0.331 | 9.37 | 12.3 | 65 | 8 |
| Inv Ex-2 | 77 | 15 | 8 | 0.670, 0.328 | 8.26 | 11.6 | 45 | 13 |

*Measured at 20 mA/cm$^2$ constant current

Comparison of the inventive examples (Inv Ex) 1 and 2 with the Comparative example 1 demonstrates the advantages of employing materials such as INV-1 with NPB as a co-host system with a dopant such as Dopant 2. The co-host system decreases the operational drive voltage by 8 and 13 percent, respectively, while simultaneously increasing efficiency 65 and 45 percent when compared to Comp-1, a single host (INV-1). This is all achieved without a significant penalty in color chromaticity. This invention provides several advantageous device features.

Device Examples 3 thru 6

An EL device (Example 3) satisfying the requirements of the invention was constructed in the following manner:

1. A glass substrate, coated with an approximately 85 nm layer of indium-tin oxide (ITO) as the anode, was sequentially ultrasonicated in a commercial detergent, rinsed in deionized water, degreased in toluene vapor and exposed to oxygen plasma for about 1 minute.
2. Over the ITO was deposited a 1 nm fluorocarbon (CF$_x$) hole injecting layer (HIL) by plasma-assisted deposition of CHF$_3$.
3. A hole transporting layer (HTL) of N,N'-di-1-naphthyl-N,N'-diphenyl-4,4'-diaminobiphenyl (NPB) having a thickness of 115 nm was then evaporated from a resistively heated tantalum boat.
4. A 35 nm light emitting layer (LEL) consisting of a mixture of INV-1 as the electron transporting co-host, NPB as the hole transporting co-host present at a concentration of 15 wt. % of the total of the co-host materials in the LEL, and Dopant 12 as a phosphorescent emitter at a concentration of 4 wt. % relative to the total of the co-host materials was then deposited onto the hole transporting layer. These materials were also evaporated from tantalum boats.
5. A hole blocking layer (HBL) of INV-1 having a thickness of 10 nm was then evaporated from another tantalum boat.
6. A 40 nm electron transporting layer (ETL) of tris(8-quinolinolato)aluminum (III) (Alq) was then deposited onto the hole blocking layer. This material was also evaporated from a tantalum boat.
7. On top of the Alq layer was deposited a 220 nm cathode formed of a 10:1 volume ratio of Mg and Ag.

The above sequence completed the deposition of the EL device. Therefore, Device Example 3 has the following structure of layers: ITO|CF$_x$ (1 nm)|NBP (115 nm)|(INV-1+15 wt. % NPB)+4 wt. % Dopant 12 (35 nm)|NV-1 (10 nm)|Alq (40 nm)|Mg:Ag (220 nm).

An EL device (Example 4) satisfying the requirements of the invention was constructed in the same manner as Example 3 except Dopant 13 was used in place of Dopant 12 at the same concentration.

An EL device (Example 5) satisfying the requirements of the invention was constructed in the same manner as Example 3 except Dopant 14 was used in place of Dopant 12 at the same concentration.

An EL device (Example 6) satisfying the requirements of the invention was constructed in the same manner as Example 3 except Dopant 15 was used in place of Dopant 12 at the same concentration.

These devices, together with a desiccant, were then hermetically packaged in a dry glove box for protection against ambient environment.

The cells thus formed were tested for efficiency and color at an operating current density of 20 mA/cm$^2$ and the results are reported in Table 4 in the form of luminance yield and CIE (Commission Internationale de l'Eclairage) coordinates.

TABLE 4

Evaluation Results for EL device Examples 3 thru 6.

| Example | Luminance Yield (cd/A) | Voltage (V) | CIE x | CIE y |
|---|---|---|---|---|
| 3 | 9.48 | 11.3 | 0.645 | 0.342 |
| 4 | 7.89 | 11.0 | 0.662 | 0.334 |
| 5 | 8.12 | 11.0 | 0.664 | 0.332 |
| 6 | 8.88 | 11.7 | 0.649 | 0.340 |

Device Example 7

An EL device (Example 7) satisfying the requirements of the invention was constructed in the following manner:

1. A glass substrate, coated with an approximately 85 nm layer of indium-tin oxide (ITO) as the anode, was sequentially ultrasonicated in a commercial detergent, rinsed in deionized water, degreased in toluene vapor and exposed to oxygen plasma for about 1 minute.
2. Over the ITO was deposited a 1 nm fluorocarbon (CF$_x$) hole injecting layer (HIL) by plasma-assisted deposition of CHF$_3$.
3. A hole transporting layer (HTL) of N,N'-di-1-naphthyl-N,N'-diphenyl-4,4'-diaminobiphenyl (NPB) having a thickness of 115 nm was then evaporated from a resistively heated tantalum boat.
4. A 35 nm light emitting layer (LEL) consisting of a mixture of INV-24 as the electron transporting co-host, NPB as the hole transporting co-host present at a concentration of 15 wt. % of the total of the co-host materials in the LEL, and Dopant 2 as a phosphorescent emitter at a concentration of 4 wt. % relative to the total of the co-host materials was then deposited onto the hole transporting layer. These materials were also evaporated from tantalum boats.
5. A hole blocking layer (HBL) of INV-24 having a thickness of 10 nm was then evaporated from another tantalum boat.
6. A 40 nm electron transporting layer (ETL) of tris(8-quinolinolato)aluminum (III) (Alq) was then deposited onto the hole blocking layer. This material was also evaporated from a tantalum boat.
7. On top of the Alq layer was deposited a 220 nm cathode formed of a 10:1 volume ratio of Mg and Ag.

The above sequence completed the deposition of the EL device. Therefore, Device Example 7 has the following structure of layers: ITO|$CF_x$ (1 nm)|NBP (115 nm)|(INV-24+15 wt. % NPB)+4 wt. % Dopant 2 (35 nm)|INV-24 (10 nm)|Alq (40 nm)|Mg:Ag (220 nm).

The device, together with a desiccant, was then hermetically packaged in a dry glove box for protection against ambient environment.

The cell thus formed was tested for efficiency and color at an operating current density of 20 mA/cm$^2$ and the results are reported in Table 5 in the form of luminance yield and CIE (Commission Internationale de l'Eclairage) coordinates.

TABLE 5

Evaluation Results for EL device Example 7.

| Example | Luminance Yield (cd/A) | Voltage (V) | CIE x | CIE y |
|---|---|---|---|---|
| 7 | 7.40 | 11.1 | 0.652 | 0.340 |

Device Example 8

An EL device (Example 8) satisfying the requirements of the invention was constructed in the following manner:
1. A glass substrate, coated with an approximately 85 nm layer of indium-tin oxide (ITO) as the anode, was sequentially ultrasonicated in a commercial detergent, rinsed in deionized water, degreased in toluene vapor and exposed to oxygen plasma for about 1 minute.
2. Over the ITO was deposited a 1 nm fluorocarbon ($CF_x$) hole injecting layer (HIL) by plasma-assisted deposition of $CHF_3$.
3. A hole transporting layer (HTL) of N,N'-di-1-naphthyl-N,N'-diphenyl-4,4'-diaminobiphenyl (NPB) having a thickness of 115 nm was then evaporated from a resistively heated tantalum boat.
4. A 35 nm light emitting layer (LEL) consisting of a mixture of INV-2 as the electron transporting co-host, NPB as the hole transporting co-host present at a concentration of 15 wt. % of the total of the co-host materials in the LEL, and Dopant 3 as a phosphorescent emitter at a concentration of 6 wt. % relative to the total of the co-host materials was then deposited onto the hole transporting layer. These materials were also evaporated from tantalum boats.
5. A hole blocking layer (HBL) of INV-2 having a thickness of 10 nm was then evaporated from another tantalum boat.
6. A 40 nm electron transporting layer (ETL) of tris(8-quinolinolato)aluminum (III) (Alq) was then deposited onto the hole blocking layer. This material was also evaporated from a tantalum boat.
7. On top of the Alq layer was deposited a 220 nm cathode formed of a 10:1 volume ratio of Mg and Ag.

The above sequence completed the deposition of the EL device. Therefore, Device Example 8 has the following structure of layers: ITO|$CF_x$ (1 nm)|NBP (115 nm)|(INV-2+15 wt. % NPB)+6 wt. % Dopant 3 (35 nm)|INV-2 (10 nm)|Alq (40 nm)|Mg:Ag (220 nm).

The device, together with a desiccant, was then hermetically packaged in a dry glove box for protection against ambient environment.

The cell thus formed was tested for efficiency and color at an operating current density of 2 mA/cm$^2$ and the results are reported in Table 6 in the form of luminance yield and CIE (Commission Internationale de l'Eclairage) coordinates.

TABLE 6

Evaluation Results for EL device Example 8.

| Example | Luminance Yield (cd/A) | Voltage (V) | CIE x | CIE y |
|---|---|---|---|---|
| 8 | 16.3 | 7.97 | 0.54 | 0.45 |

The entire contents of the patent materials and publications referred to in this specification are incorporated herein by reference. The invention has been described in detail with particular reference to certain preferred embodiments thereof, but it will be understood that variations and modifications can be effected within the spirit and scope of the invention.

PARTS LIST

101 Substrate
103 Anode
105 Hole-Injecting layer (HIL)
107 Hole-Transporting layer (HTL)
109 Light-Emitting layer (LEL)
110 Hole-blocking layer (HBL)
111 Electron-Transporting layer (ETL)
113 Cathode

The invention claimed is:
1. An organic light emitting device containing a cathode, an anode, and having located there-between a light emitting layer comprising:
    A) co-hosts including
        a) a hole transporting compound, and
        b) an oxinoid compound, wherein the oxinoid is an aluminum bis-(2-substituted)oxinoid compound bearing a third ligand linked to aluminum through an oxy moiety comprising an oxygen atom linked to an aromatic ring bearing at least one substituent at an ortho position; and
    B) a red or orange light emitting phosphorescent compound wherein the phosphorescent compound has a triplet energy smaller than that of the co-hosts.
2. The device of claim 1 wherein there are substituents at ortho and meta positions on the oxy moiety that join to form a fused ring.
3. The device of claim 1 wherein the oxy moiety includes two substituents selected from the ortho and meta positions, and a fused ring originating from substituents at the ortho and meta positions.

4. The device of claim 1 wherein the oxy moiety includes two ortho substituents.
5. An electroluminescent device according to claim 1 wherein the oxinoid is selected from the group consisting of the following:
INV-1
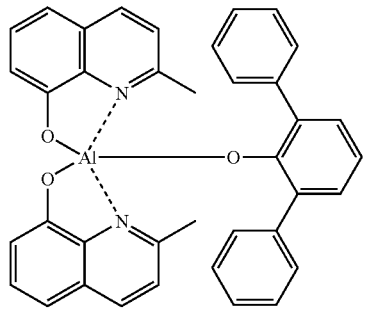
INV-2
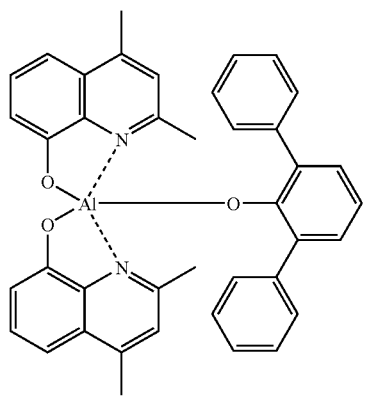
INV-3
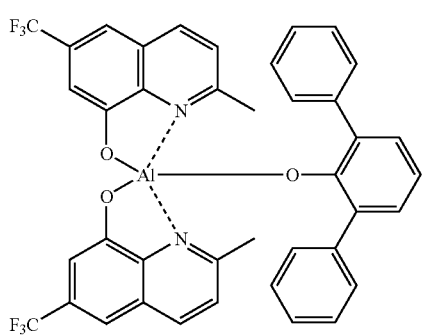
INV-4
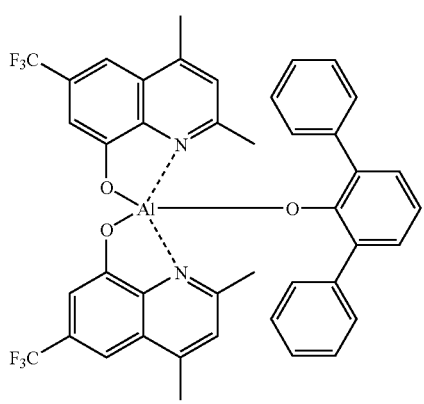
-continued
INV-5
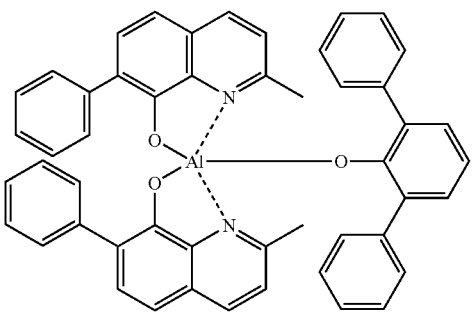
INV-6
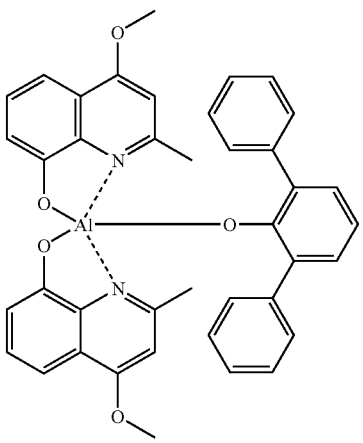
INV-7
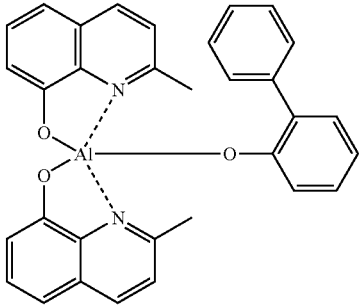
INV-8
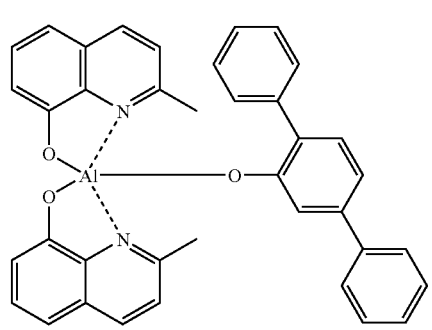

-continued
INV-9
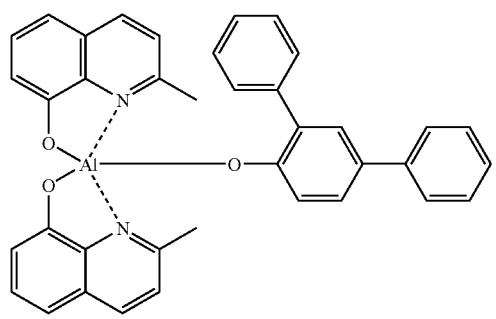
INV-10
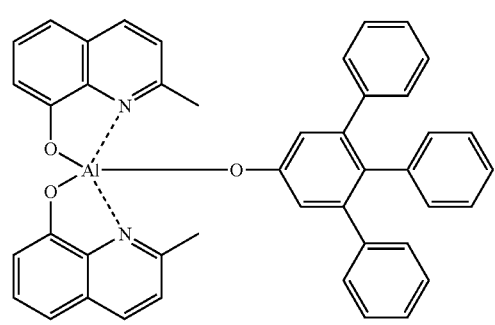
INV-11
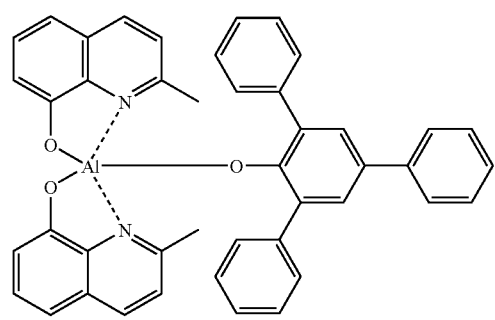
INV-12
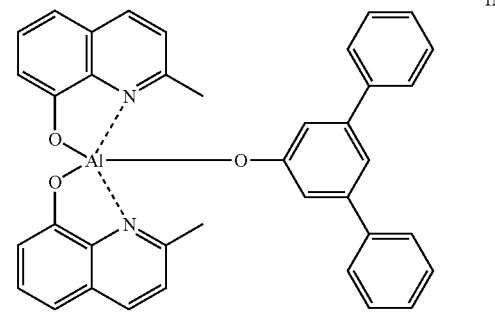
INV-13
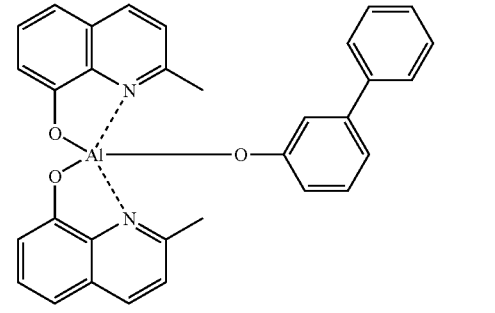
-continued
INV-14
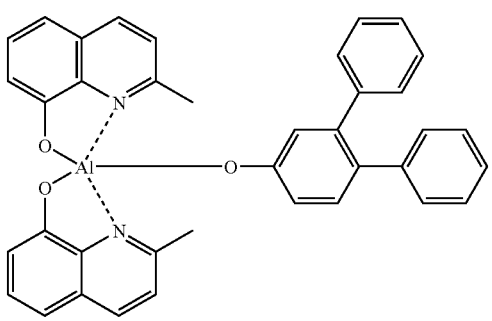
INV-15
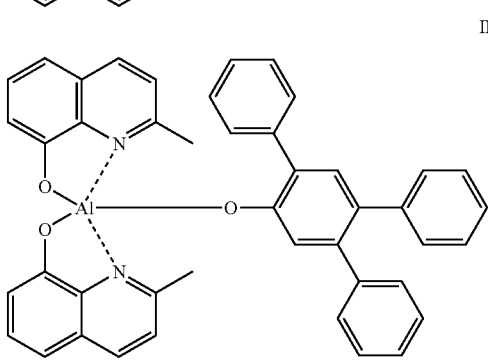
INV-16
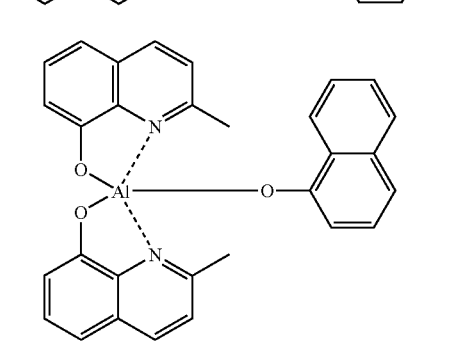
INV-17
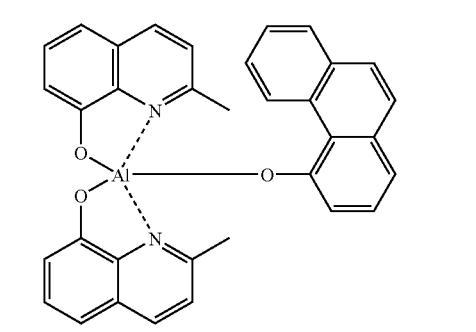
INV-18
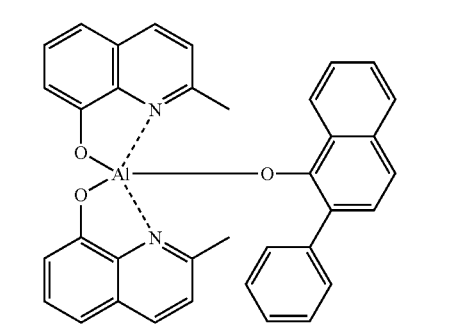

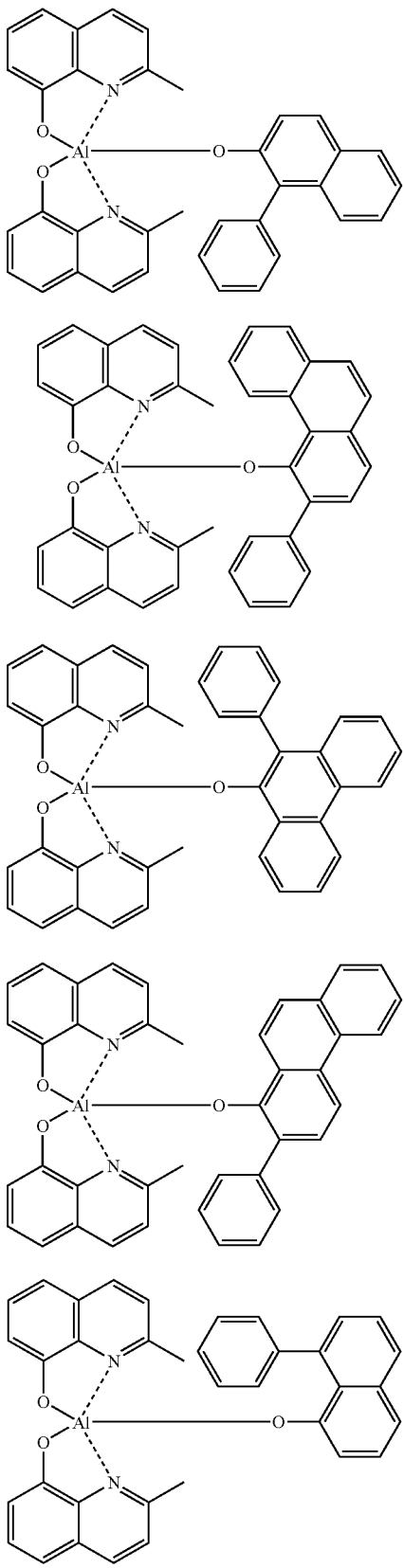

INV-19

INV-20

INV-21

INV-22

INV-23

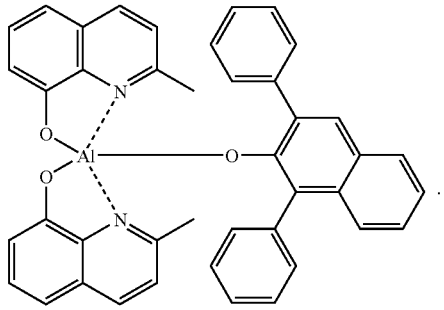

INV-24

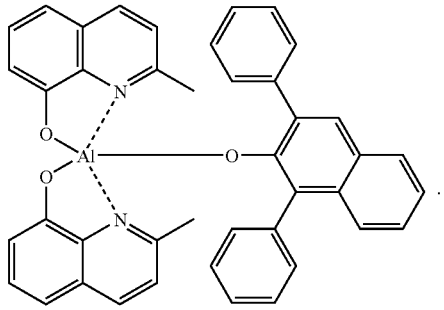

6. An electroluminescent device according to claim 1 wherein the hole transporting compound includes a triarylamine with a triplet energy greater than that of the dopant.

7. An electroluminescent device according to claim 1 wherein the hole transporting compound includes one selected from benzidine based triarylamines.

8. An electroluminescent device according to claim 1 wherein the hole transporting compound is selected from 4,4'-bis[N-(1-naphthyl)-N-phenylamino]biphenyl; 4,4'-bis[N-(3-methylphenyl)-N-phenylamino]biphenyl; and 4,4'-Bis[N-(1-naphthyl)-N-(2-naphthyl)amino]biphenyl.

9. An electroluminescent device according to claim 1 wherein the hole transporting compound includes an azole.

10. An electroluminescent device according to claim 1 wherein the hole transporting compound is an azole selected from 4,4'-N,N'-dicarbazole-biphenyl; 4,4'-bis(9-carbazolyl)-2,2'-dimethylbiphenyl; and 4,4',4"-tris(carbazol-9-yl)triphenylamine.

11. The organic light emitting device of claim 1 wherein the oxinoid compound comprises a bis-oxinoid moiety and an oxy moiety and is represented by formula (1):

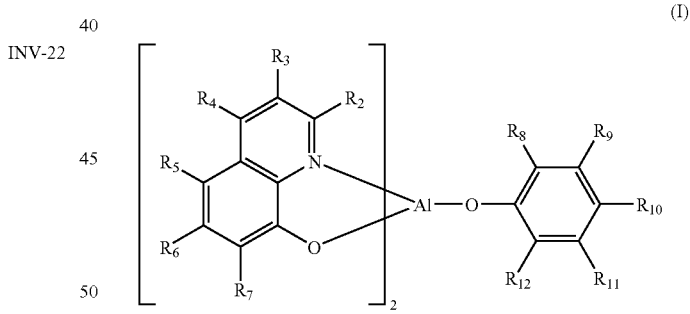

(I)

wherein:

$R_2$ represents an electron donating group, $R_3$ and $R_4$ each independently represent hydrogen or an electron donating group, $R_5$, $R_6$, and $R_7$ each independently represent hydrogen or an electron accepting group, in the oxymoiety, $R_{10}$ represents hydrogen or a substituent group, at least one of $R_8$ and $R_{12}$ represents a substituent group, and $R_9$ and $R_{11}$ represent hydrogen or a substituent group, provided that two of $R_8$-$R_{12}$ may join to form a ring.

12. The organic light emitting device of claim 11 with the proviso that $R_9$ and $R_{10}$ or $R_{11}$, may join to form a fused ring provided only that at least one of the remaining $R_8$, $R_9$, $R_{11}$, and $R_{12}$ represents a substituent group.

13. An electroluminescent device according to claim 11 wherein at least one of $R_8$-$R_{12}$ is an alkyl or aryl group.

14. An electroluminescent device according to claim 11 wherein the oxinoid group is derived from one of the following:

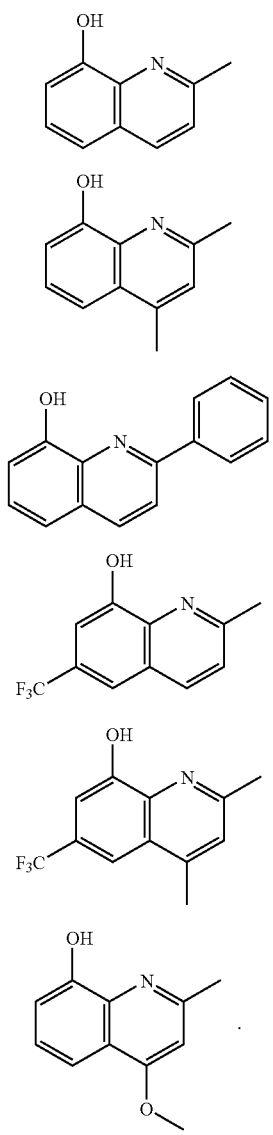

15. An electroluminescent device according to claim 11 wherein the oxinoid is derived from a 2-methyl-8-hydroxyquinoline.

16. An electroluminescent device according to claim 11 wherein $R_2$ is an electron donating group selected from those having the formulas —R', —OR', and —NR'(R") where R' is a hydrocarbon containing up to 6 carbon atoms and R" is hydrogen or R'.

17. An electroluminescent device according to claim 15 wherein $R_2$ is an electron donating group selected from methyl, ethyl, phenyl, methoxy, ethoxy, phenoxy, —N(CH$_3$)$_2$, —N(CH$_2$CH$_3$)$_2$, —NHCH$_3$, —N(C$_6$H$_5$)$_2$, —N(CH$_3$)(C$_6$H$_5$), and —NHC$_6$H$_5$ groups.

18. An electroluminescent device according to claim 11 wherein at least one of $R_5$, $R_6$, and $R_7$ is an electron accepting group.

19. An electroluminescent device according to claim 11 wherein at least one of $R_5$, $R_6$, and $R_7$ is chosen from cyano, α-haloalkyl, α-haloalkoxy, amido, sulfonyl, carbonyl, carbonyloxy and oxycarbonyl groups.

20. An electroluminescent device according to claim 11 wherein at least one of $R_5$, $R_6$, and $R_7$ is chosen from include —CN, —F, —CF$_3$, —OCF$_3$, —CONHC$_6$H$_5$, —SO$_2$C$_6$H$_5$, —COC$_6$H$_5$, —CO$_2$C$_6$H$_5$, and —OCOC$_6$H$_5$ groups.

21. An electroluminescent device according to claim 11 wherein the oxy moiety is derived from one of the following:

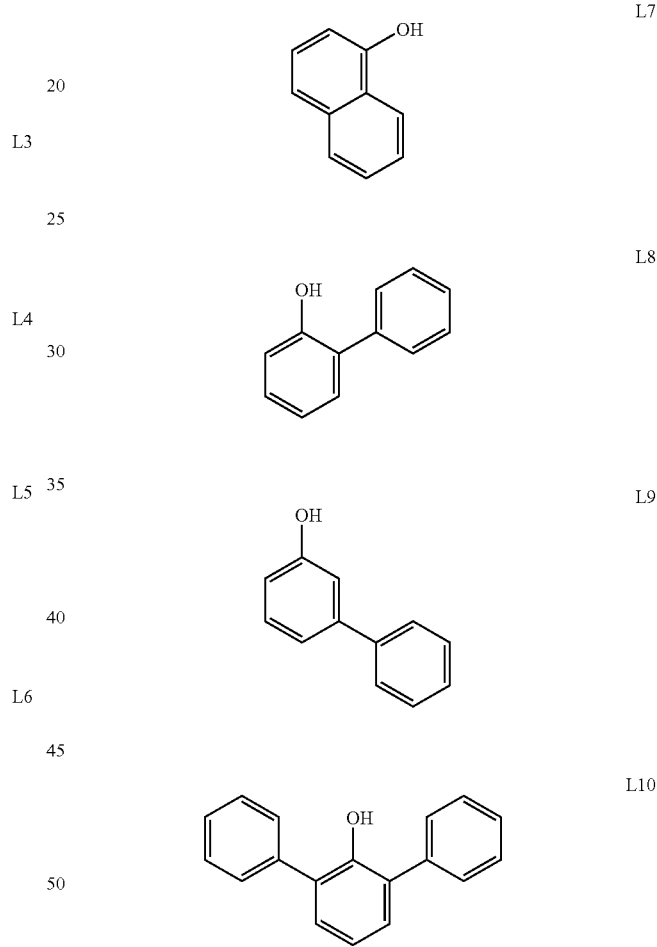

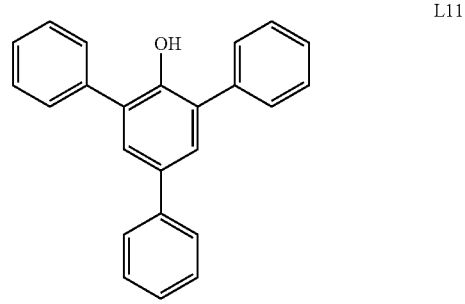

-continued
L12
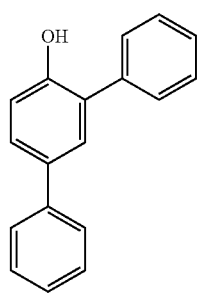
L13
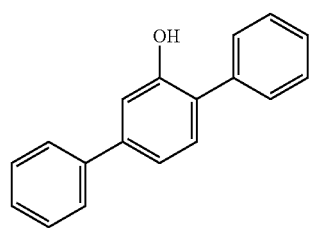
L14
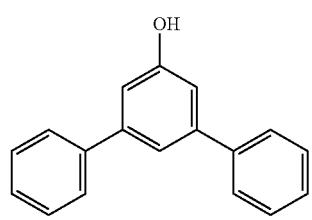
L15
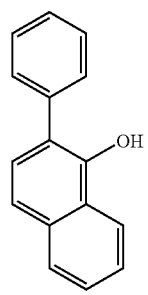
L16
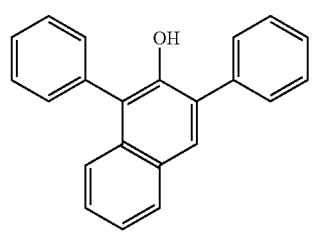
L17
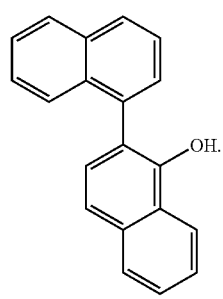
22. An electroluminescent device according to claim 11 wherein the oxy moiety is derived from the following
L8
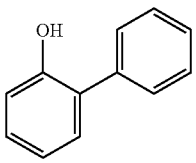
L10
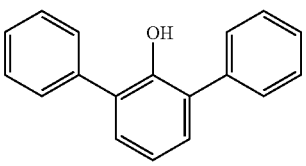
L11
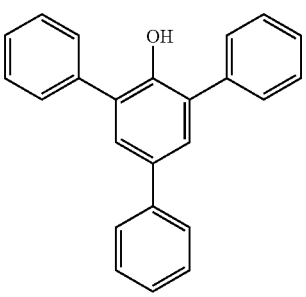
L12
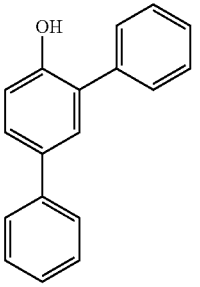
L13
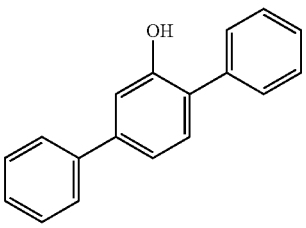
L15
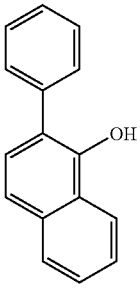

-continued

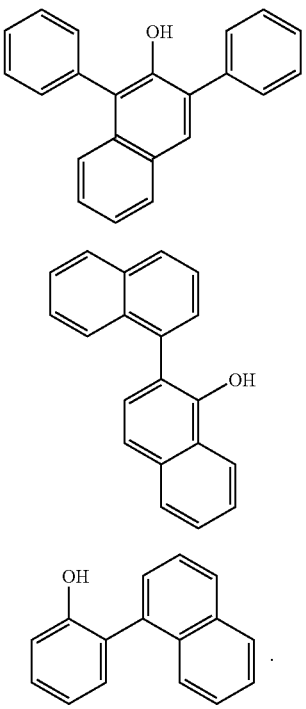

L16

L17

L18

23. An electroluminescent device according to claim 1 wherein the light-emitting phosphorescent component is an organometallic complex.

24. The device of claim 1 wherein the phosphorescent emitting material is an organometallic compound comprising a 3rd-row transition metal.

25. The device of claim 24 wherein the metal is iridium or platinum.

26. The device of claim 24 wherein the organometallic complex includes a ligand that can be coordinated to a metal through an $sp^2$ carbon and a heteroatom.

27. The device of claim 26 wherein the ligand is a substituted or unsubstituted phenylpyridine.

28. The device of claim 24 wherein the organometallic compound is chosen from tris(1-phenylisoquinolinato-N,$C^{2'}$) Iridium(III) ), bis(1-phenylisoquinolinato-N,$C^{2'}$)iridium(III) (acetylacetonate), and platinum octaethylporphyrin.

29. The device of claim 6 wherein the triarylamine is present at a weight percent greater than 10 percent of the components in the LEL.

30. An electroluminescent device according to claim 1, wherein the light-emitting layer is adjacent to a layer comprising a hole blocking material.

31. The device of claim 1 wherein the phosphorescent material compound is present in an amount of up to 15±5 wt % based on the co-host materials.

32. The device of claim 1 wherein the light-emitting material is part of a polymer.

33. The device of claim 1 which emits white light.

34. A display comprising the OLED device of claim 1.

35. An area lighting device comprising the OLED device of claim 1.

36. A process for emitting light by applying a potential across the device of claim 1.

37. An electroluminescent device according to claim 1 wherein the light emitting phosphorescent compound is a tris-C,N-cyclometallated Iridium(III) complex.

38. An electroluminescent device according to claim 37 wherein the light emitting phosphorescent compound is a tris-C,N-cyclometallated Iridium(III) complex having one C,N-cyclometallating ligand different from the other two.

39. An electroluminescent device according to claim 1 wherein the light emitting phosphorescent compound is selected from the group consisting of bis(1-phenylisoquinolinato-N,$C^{2'}$)(2-phenylpyridinato-N,$C^{2'}$)Iridium(III), bis(2-phenylpyridinato-N,$C^{2'}$)(1-phenylisoquinolinato-N,$C^{2'}$)Iridium(III), bis(1-phenylisoquinolinato-N,$C^{2'}$)(2-phenyl-5-methyl-pyridinato-N,$C^{2'}$)Iridium(III), bis(1-phenylisoquinolinato-N,$C^{2'}$)(2-phenyl-4-methyl-pyridinato-N,$C^{2'}$)Iridium(III), and bis(1-phenylisoquinolinato-N,$C^{2'}$)(2-phenyl-3-methyl-pyridinato-N,$C^{2'}$)Iridium(III).

40. An electroluminescent device according to claim 1, wherein the oxy moiety is derived from

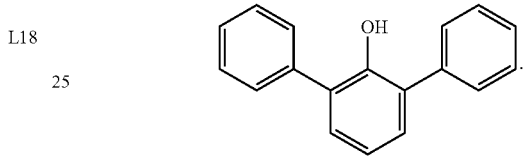

41. An electroluminescent device according to claim 40, wherein the hole transporting compound includes NPB.

42. An electroluminescent device according to claim 40, wherein the phosphorescent compound is

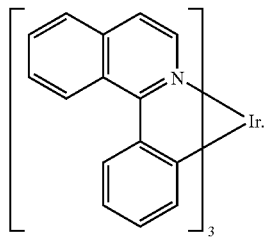

43. An electroluminescent device according to claim 41, wherein the phosphorescent compound is

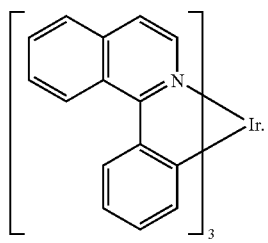

44. An electroluminescent device according to claim 40, wherein the phosphorescent compound is non-polymeric.

* * * * *

UNITED STATES PATENT AND TRADEMARK OFFICE
CERTIFICATE OF CORRECTION

PATENT NO.        : 7,579,090 B2                                    Page 1 of 3
APPLICATION NO. : 11/016134
DATED             : August 25, 2009
INVENTOR(S)       : Christopher T. Brown et al.

It is certified that error appears in the above-identified patent and that said Letters Patent is hereby corrected as shown below:

Column 43, lines 15-30         In Claim 5 below
(Approx.)

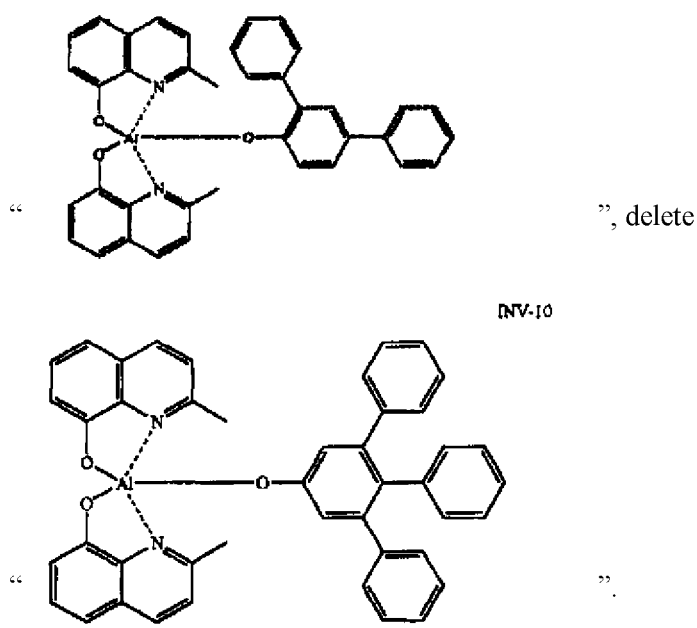

", delete
```
```
".

CERTIFICATE OF CORRECTION (continued)
U.S. Pat. No. 7,579,090 B2

| | |
|---|---|
| Column 43-44, lines 40-65 and 5-15 (Approx.) | In Claim 5, below |

" 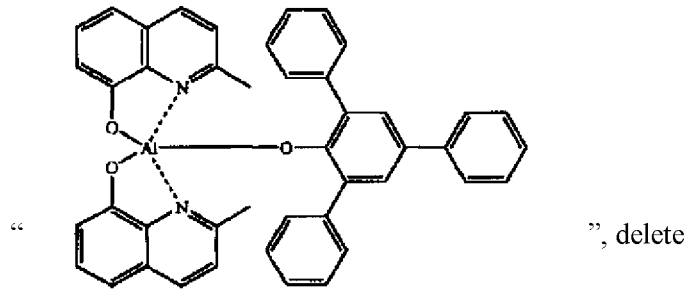 ", delete

" 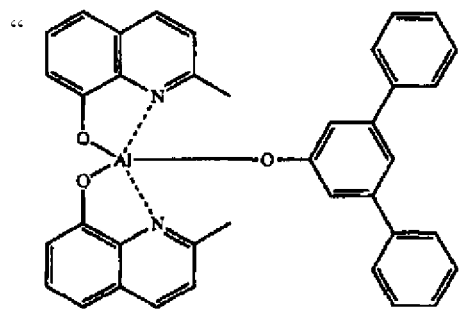

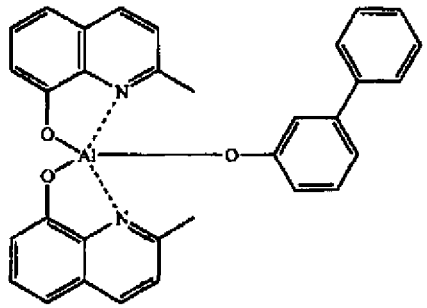

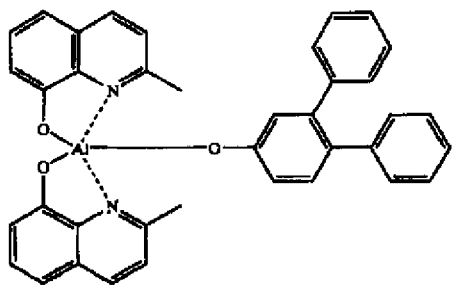 ".

| | |
|---|---|
| Column 46, line 26 | In Claim 8, delete "Bis" and insert -- bis --, therefor. |
| Column 46, lines 33-34 (Approx.) | In Claim 10, delete "triphcnylamine." and insert -- triphenylamine. --, therefor. |
| Column 46, line 55 (Approx.) | In Claim 11, delete "$R_4$each" and insert -- $R_4$ each --, therefor. |

CERTIFICATE OF CORRECTION (continued)
U.S. Pat. No. 7,579,090 B2

| | |
|---|---|
| Column 46, line 57 (Approx.) | In Claim 11, delete "$R_6$,and" and insert -- $R_6$, and --, therefor. |
| Column 46, line 58 | In Claim 11, delete "oxymoiety," and insert -- oxy moiety, --, therefor. |
| Column 46, line 65 | In Claim 12, delete "or $R_{11}$," and insert -- or $R_{10}$ and $R_{11}$ --, therefor. |
| Column 48, lines 35-45 (Approx.) | In Claim 21, below  " delete 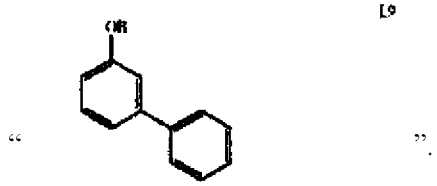". |
| Column 49, lines 25-35 (Approx.) | In Claim 21, below 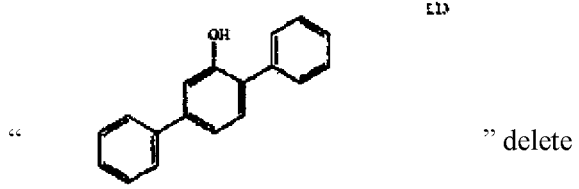 " delete 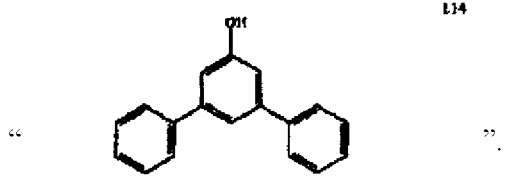". |
| Column 51, line 46 (Approx.) | In Claim 28, delete "(III) )," and insert -- (III), --, therefor. |
| Column 52, line 13 (Approx.) | In Claim 39, delete "N,C$^{2'}$)(2-phenyl" and insert -- N,C$^{2'}$)(2-phenyl --, therefor. |

Signed and Sealed this

Nineteenth Day of January, 2010

David J. Kappos
*Director of the United States Patent and Trademark Office*